United States Patent
Walker

(10) Patent No.: US 9,958,341 B2
(45) Date of Patent: May 1, 2018

(54) SEMICONDUCTOR DEVICE HAVING TEMPERATURE SENSOR CIRCUIT THAT DETECTS A TEMPERATURE RANGE UPPER LIMIT VALUE AND A TEMPERATURE RANGE LOWER LIMIT VALUE

(71) Applicant: Darryl G. Walker, San Jose, CA (US)

(72) Inventor: Darryl G. Walker, San Jose, CA (US)

( * ) Notice: Subject to any disclaimer, the term of this patent is extended or adjusted under 35 U.S.C. 154(b) by 0 days. days.

(21) Appl. No.: 15/713,643

(22) Filed: Sep. 23, 2017

(65) Prior Publication Data

US 2018/0010968 A1 Jan. 11, 2018

Related U.S. Application Data

(63) Continuation of application No. 14/265,642, filed on Apr. 30, 2014, now Pat. No. 9,772,232.

(Continued)

(51) Int. Cl.

| G01K 7/00 | (2006.01) |
|---|---|
| G01K 7/16 | (2006.01) |
| G01K 13/00 | (2006.01) |
| H03K 17/687 | (2006.01) |
| H03K 17/14 | (2006.01) |
| G11C 7/04 | (2006.01) |
| G11C 11/406 | (2006.01) |
| H03K 21/10 | (2006.01) |
| G11C 11/4074 | (2006.01) |
| G11C 11/4093 | (2006.01) |
| G11C 11/4096 | (2006.01) |
| G01K 3/00 | (2006.01) |

(Continued)

(52) U.S. Cl.
CPC .............. *G01K 7/16* (2013.01); *G01K 3/005* (2013.01); *G01K 7/00* (2013.01); *G01K 7/01* (2013.01); *G01K 13/00* (2013.01); *G11C 7/00* (2013.01); *G11C 7/04* (2013.01); *G11C 11/407* (2013.01); *G11C 11/4074* (2013.01); *G11C 11/4093* (2013.01); *G11C 11/4096* (2013.01); *G11C 11/40626* (2013.01); *H03K 3/012* (2013.01); *H03K 17/145* (2013.01); *H03K 17/223* (2013.01); *H03K 17/687* (2013.01); *H03K 21/10* (2013.01); *Y10T 307/773* (2015.04)

(58) Field of Classification Search
USPC ................. 374/170, 100, 163, 178
See application file for complete search history.

(56) References Cited

U.S. PATENT DOCUMENTS

2009/0306536 A1* 12/2009 Ranganathan ........... A61B 5/01
600/549
2015/0276500 A1 10/2015 Walker
(Continued)

OTHER PUBLICATIONS

U.S. Appl. No. 14/265,642, filed Apr. 30, 2014, parent of the present application.

*Primary Examiner* — Mirellys Jagan

(57) ABSTRACT

A method can include, in response to a power supply voltage transition, setting a temperature window to a first temperature range by operation of a temperature circuit formed on a semiconductor device. In response to a temperature of the semiconductor device being determined to be outside of the first temperature range, changing the temperature range of the temperature window until the temperature of the semiconductor device is determined to be within the temperature window.

20 Claims, 20 Drawing Sheets

Related U.S. Application Data

(60) Provisional application No. 61/971,702, filed on Mar. 28, 2014.

(51) Int. Cl.
    *G01K 7/01*         (2006.01)
    *H03K 17/22*      (2006.01)
    *G11C 11/407*    (2006.01)
    *G11C 7/00*        (2006.01)
    *H03K 3/012*     (2006.01)

(56) References Cited

U.S. PATENT DOCUMENTS

| | | | |
|---|---|---|---|
| 2015/0280702 A1* | 10/2015 | Walker | G01K 7/16 327/543 |
| 2016/0054379 A1* | 2/2016 | Walker | G01R 31/025 324/750.03 |
| 2016/0054380 A1* | 2/2016 | Walker | G01R 31/025 324/750.03 |
| 2016/0169750 A1* | 6/2016 | Walker | G01K 7/16 365/189.011 |

* cited by examiner

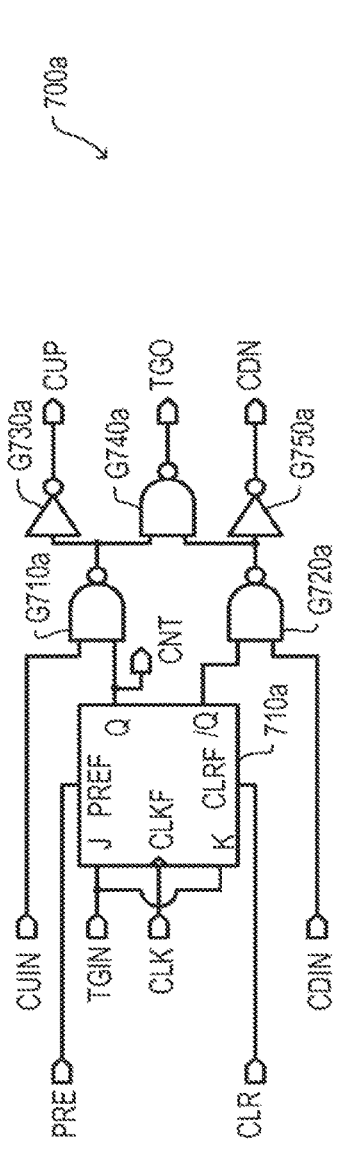
FIG. 7a
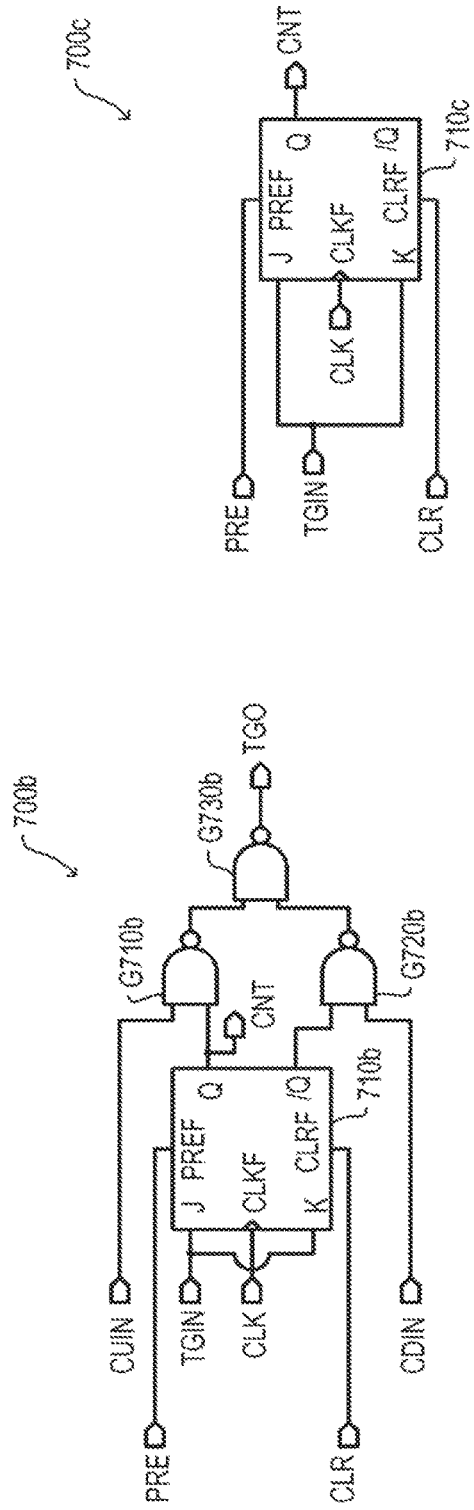
FIG. 7c
FIG. 7b

SEMICONDUCTOR DEVICE HAVING TEMPERATURE SENSOR CIRCUIT THAT DETECTS A TEMPERATURE RANGE UPPER LIMIT VALUE AND A TEMPERATURE RANGE LOWER LIMIT VALUE

This application is a continuation of U.S. patent application Ser. No. 14/265,642, filed Sep. 26, 2017, which claims the benefit of U.S. Provisional Patent Application Ser. No. 61/971,702, filed Mar. 28, 2014, the contents both of which are incorporated by reference herein.

TECHNICAL FIELD

The present invention relates generally to a semiconductor device, and more particularly to a semiconductor device including temperature sensing circuits that provide operating parameter selection.

BACKGROUND OF THE INVENTION

Semiconductor devices include components that have characteristics that vary with respect to temperature. For example, as temperature increases mobility of charge carriers decreases causing transistors, such as insulated gate field effect transistors (IGFET) to have lower drive current. Although drive current decreases, leakage current (leakage current when the IGFET is turned off) increases. These temperature dependent characteristics can make design problematic.

When designing a semiconductor device, the designer will design circuit timing and internally regulated power supply voltages for worst case corners. Typically, a fast corner may be high voltage, low temperature and a slow corner may be low voltage and high temperature. By designing circuits in a semiconductor device for a worst case temperature, power may be unnecessarily wasted at another temperature point. For example, a power supply may provide a voltage that is unnecessarily high at a first temperature point due to the necessity of ensuring specifications are met at a second temperature point, even though the semiconductor device rarely operates at the second temperature point. This can cause power to be wasted at the first temperature point, which is where the semiconductor device typically operates.

A specific example is an internal refresh operation in a dynamic random access memory (DRAM). At a low temperature, charge on a DRAM capacitor in a DRAM memory cell may degrade more slowly than at high temperature. However, to ensure specifications are met, the frequency of refresh operations may be unnecessarily high at low temperatures to ensure the high temperature case is met. This can cause unnecessary power consumption in typical operating temperatures.

Unnecessary power consumption is even more important in mobile devices as it reduces battery lifetime.

In light of the above, it would be desirable to provide a semiconductor device in which parameters may be varied with respect to operating temperature.

BRIEF DESCRIPTION OF THE DRAWINGS

FIG. 7a is a circuit schematic diagram of a counter cell according to an embodiment.
FIG. 7b is a circuit schematic diagram of a counter cell according to an embodiment.
FIG. 7c is a circuit schematic diagram of a counter cell according to an embodiment.

DETAILED DESCRIPTION OF THE EMBODIMENTS

According to the embodiments set forth below, a semiconductor device can include a temperature sensing circuit.

The temperature sensing circuits can include at least one variable resistor that can set a temperature range. A counter may incrementally change in accordance with a temperature of the semiconductor device changing outside of the bounds of the range. The resistance value of the at least one variable resistor can change in response to the count output of the counter such that the temperature range can change. Furthermore, the value of the counter may select parameters stored in a table to set performance parameters of various operational circuits. In this way, functionality of the semiconductor device may be assured over a large temperature range without wasting power and/or degrading performance unnecessarily.

Figure 1:
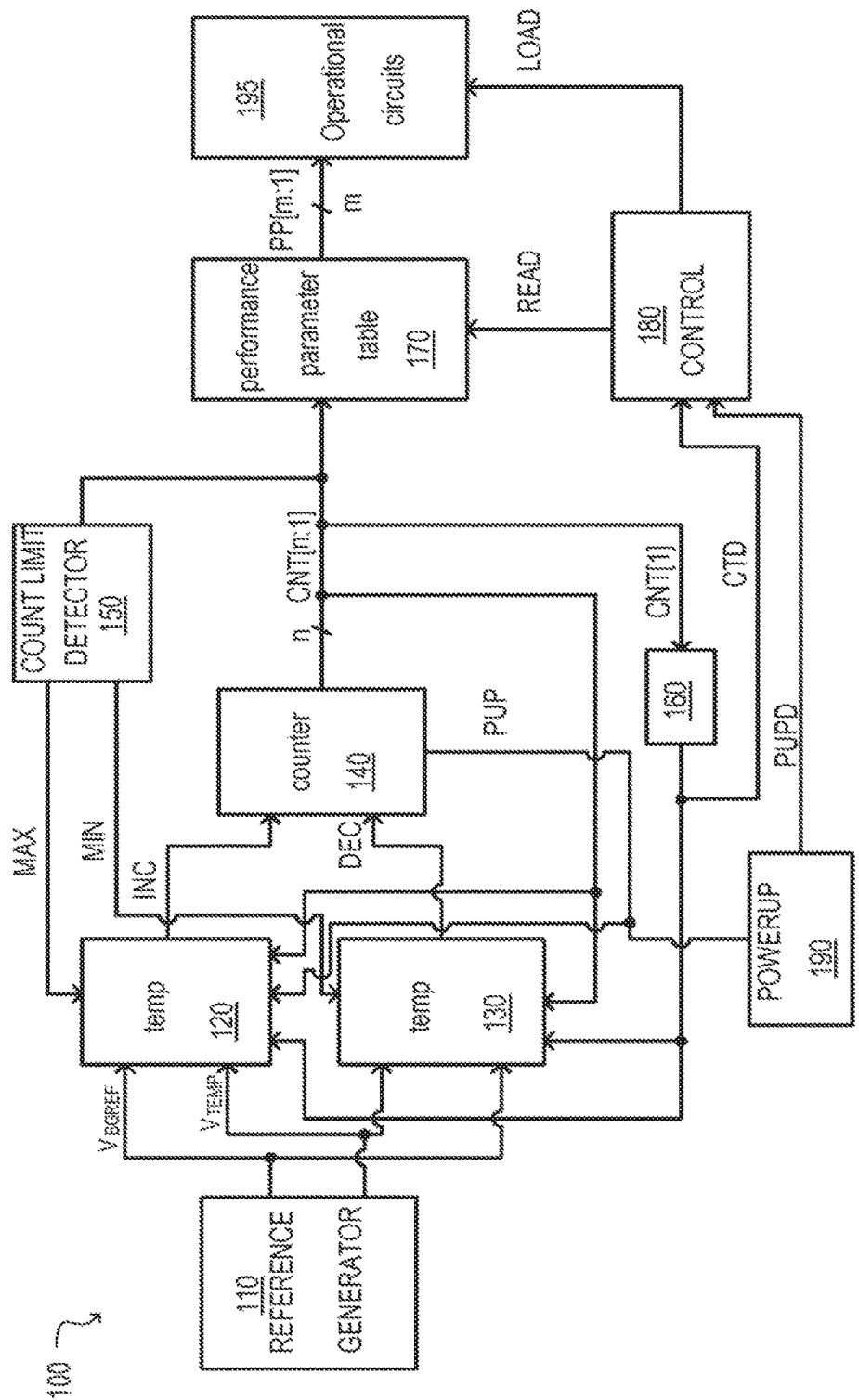
FIG. 1 is a block schematic diagram of a semiconductor device according to an embodiment.

Referring now to FIG. 1, a semiconductor device according to an embodiment is set forth in a block schematic diagram and given the general reference character 100.

Semiconductor device 100 may include a reference voltage generator 110, temperature sensor circuits (120 and 130), and a counter circuit 140. Semiconductor device 100 may also include a count limit detector 150, a transition detector 160, a performance parameter table 170, a control circuit 180, a power up circuit 190, and operational circuits 195.

Voltage generator 110 may provide a reference voltage $V_{BGREF}$ and a reference voltage $V_{TEMP}$. Reference voltage $V_{BGREF}$ may be a reference potential that is essentially independent of temperature. Reference voltage $V_{BGREF}$ may be provided as a reference potential to temperature sensor circuits (120 and 130). Reference voltage $V_{TEMP}$ may be provided as a temperature dependent potential to temperature sensor circuits (120 and 130).

Temperature sensor circuit 120 may receive reference voltages ($V_{BGREF}$ and $V_{TEMP}$), count limit signal MAX, count transition signal CTD, power up signal PUP, and count value CNT[n:1] as inputs and may provide an increment signal INC as an output. Temperature sensor circuit 130 may receive reference voltages ($V_{BGREF}$ and $V_{TEMP}$), count limit signal MIN, count transition signal CTD, power up signal PUP, and count value CNT[n:1] as inputs and may provide decrement signal DEC as an output. Temperature sensor circuit 120 may provide a temperature range upper limit value based on the count value CNT[n:1] and temperature sensor circuit 130 may provide a temperature range lower limit value based on the count value CNT[n:1].

Counter circuit 140 may receive increment signal INC, decrement signal DEC, and power up signal PUP as inputs and may provide count value CNT[n:1] as an output. Counter circuit 140 may incrementally increase count value CNT[n:1] in response to increment signal INC transitioning from a logic low to a logic high level and may incrementally decrease count value CNT[n:1] in response to decrement signal DEC transitioning from a logic low to a logic high level.

Count limit detector 150 may receive count value CNT[n:1] and may provide count limit signals (MAX and MIN) as outputs. Count limit signal MAX may transition from a logic low to a logic high level when count value CNT[n:1] has a maximum allowed value. Count limit signal MIN may transition from a logic low to a logic high level when count value CNT[n:1] has a minimum allowed value.

Transition detector 160 can receive the least significant bit CNT[1] from count value CNT[n:1] and may provide a count transition signal CTD. Count transition signal CTD may be a pulse signal generated in response to a logic transition in the least significant bit CNT[1] from count value CNT[n:1].

Performance parameter table 170 may receive count value CNT[n:1] and a read signal READ as inputs and may provide performance parameters PP[m:1] as an output. Performance parameters PP[m:1] may include m bits. Performance parameter table 170 may include a non-volatile memory array providing performance parameters PP[m:1] in accordance to an address corresponding to the value of count value CNT[n:1] in response to read signal READ.

Control circuit 180 may receive a power up signal PUPD and count transition signal CTD and may provide read signal READ and a load signal LOAD as outputs. Power up circuit 190 may provide power up signals (PUP and PUPD) as outputs in response to power being applied to semiconductor device 100.

Operational circuits 195 may receive performance parameters PP[m:1] and load signal LOAD. Operational circuits 195 may latch performance parameters PP[m:1] into latches in response to load signal LOAD. The latched performance parameters may modify the operation of circuitry, for example, increase or decrease time delays, change the magnitude of potential levels, and/or vary threshold voltages in IGFETs, as just a few examples. In this way, circuitry in operational circuits 195 may operate over a large temperature range without unduly wasting power or adversely affecting speed at one temperature in order to provide functionality margin at another temperature.

Figure 2:
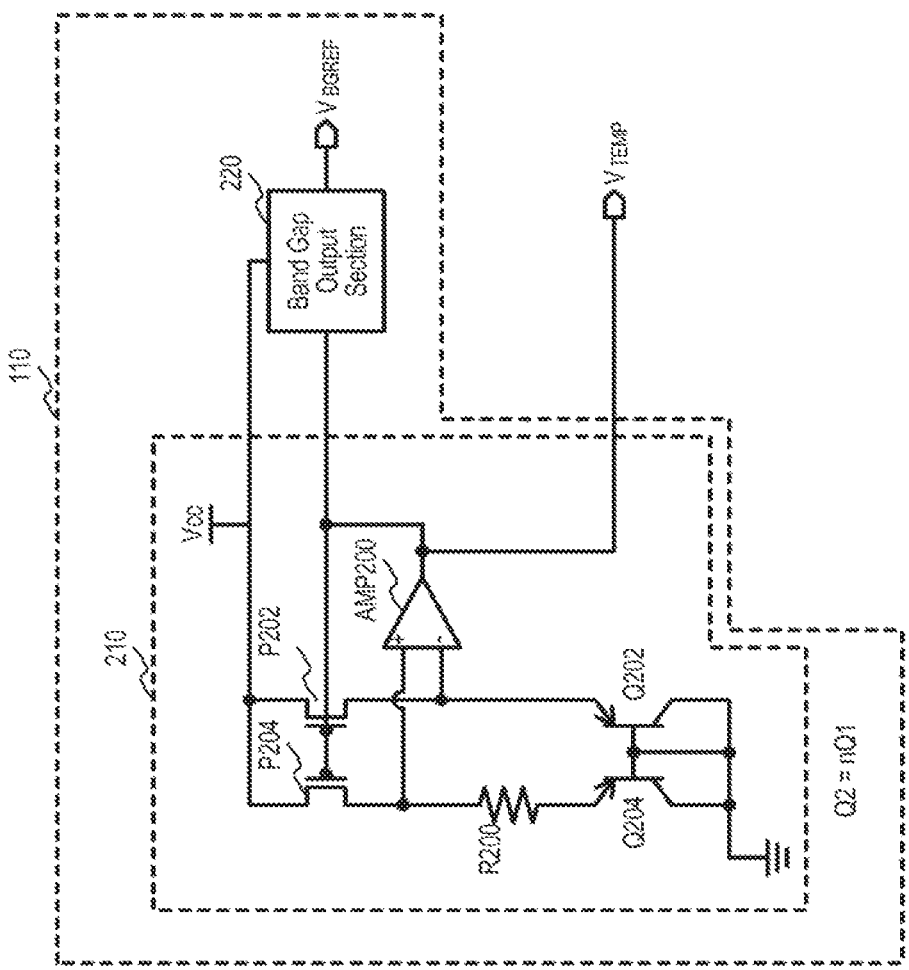
FIG. 2 is a circuit schematic diagram of a reference voltage generator according to an embodiment.

Referring now to FIG. 2, reference voltage generator 110 is set forth in a circuit schematic diagram.

Reference voltage generator 110 may include a bandgap reference input section 210 and a bandgap reference output section 220. Bandgap reference input section 210 may provide a voltage $V_{TEMP}$. The potential of voltage $V_{TEMP}$ may change inversely to the change in the temperature of the semiconductor device 100. Bandgap reference output section 220 can receive voltage $V_{TEMP}$ and may provide an essentially temperature independent reference voltage $V_{BGREF}$. An example of a bandgap reference output section providing a temperature independent reference voltage can be seen in U.S. Pat. No. 6,150,872 incorporated herein by reference or U.S. Pat. No. 6,549,065 incorporated herein by reference, as just two examples.

Bandgap reference input section 210 may include bipolar transistors (Q202 and Q204), resistor 8200, transistors (P202 and P204), and amplifier AMP200. Bipolar transistor Q202 may have an emitter commonly connected to a negative input of amplifier AMP200 and a drain of transistor P202. Bipolar transistor Q204 may have an emitter connected to a first terminal of resistor 8200. Bipolar transistors (Q202 and Q204) may have bases and collectors commonly connected to a ground terminal. Alternatively, in some cases the bases and collectors may be connected to a negatively charged substrate voltage, as just one more example. Resistor 8200 may have a second terminal commonly connected to a positive input of amplifier AMP200 and a drain of transistor P204. Amplifier AMP200 may provide voltage $V_{TEMP}$ as an output, which is also fed back to the gates of transistors (P202 and P204). Transistors (P202 and P204) may have sources connected to a power supply voltage Vcc.

Bipolar transistors (Q202 and Q204) may be substrate pnp bipolar transistors and transistor Q204 may be sized at nQ202. Transistors (P202 and P204) may be p-channel insulated gate field effect transistors (IGFET), such as MOSFETs.

Figure 3:
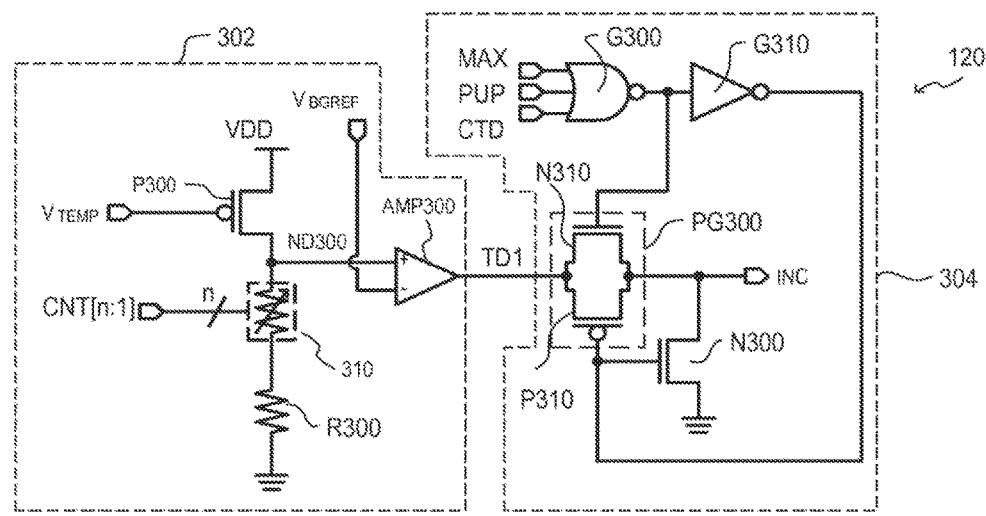
FIG. 3 is a circuit schematic diagram of a temperature sensing circuit according to an embodiment.

Referring now to FIG. 3, temperature sensor circuit 120 according to an embodiment is set forth in a circuit schematic diagram. Temperature sensor circuit 120 may receive reference voltages ($V_{BGREF}$ and $V_{TEMP}$), count limit signal MAX, count transition signal CTD, power up signal PUP, and count value CNT[n:1] as inputs and may provide an increment signal INC as an output.

Temperature sensor circuit 120 can include a temperature sensing portion 302 and an increment signal output portion 304 Temperature sensing portion 302 can receive reference voltages ($V_{BGREF}$ and $V_{TEMP}$), and count value CNT[n:1] as inputs and may provide a temperature detect signal TD1 as an output. Temperature increment signal output portion 304 can receive temperature detect signal TD1, count limit signal MAX, count transition signal CTD, and power up signal PUP as inputs and may provide an increment signal INC as an output.

Temperature sensing portion 302 can include a p-channel insulated gate field effect transistor (IGFET) P300, a variable resistor 310, a resistor R300, and an amplifier AMP300. Increment signal output portion 304 can include a NOR logic gate G300, an inverter logic gate G310, a pass gate PG300, and an n-channel IGFET N300.

P-channel IGFET P300 may have a source terminal connected to a power supply potential VDD, a drain commonly connected to a first terminal of variable resistor 310 and a positive input terminal of amplifier AMP300 at node ND300, and a gate terminal connected to receive voltage $V_{TEMP}$. The potential of voltage $V_{TEMP}$ may change inversely to the change in the temperature of the semiconductor device 100. Variable resistor 310 may receive count value CNT[n:1] as inputs and may have a second terminal connected to a first terminal of resistor R300. Resistor R300 may have a second terminal connected to a ground potential. Amplifier AMP300 may have a negative input terminal connected to receive voltage $V_{BGREF}$. Voltage $V_{BGREF}$ may not vary with temperature and may have an essentially constant potential. Amplifier circuit AMP300 may provide temperature detect signal TD1 as an output.

NOR logic gate G300 may receive count limit signal MAX, power up signal PUP, and count transition signal CTD as inputs and may provide an output. Inverter logic gate G310 may receive the output of NOR logic gate G300 at an input terminal and may provide an output. Pass gate PG300 may receive the output of NOR logic gate G300 and inverter logic gate G310 as inputs and may provide a controllable impedance path between the output of amplifier AMP300 and the increment signal INC. N-channel IGFET N300 may have a drain terminal connected to increment signal INC, a source connected to a ground potential and a gate terminal connected to receive the output of inverter logic gate G310.

Pass gate PG300 may include an n-channel IGFET N310 and a p-channel IGFET P310 having source/drain terminals connected in parallel between the output of amplifier AMP300 and an output terminal to provide increment signal INC. N-channel IGFET N310 may receive the output of NOR logic gate G300 at a gate terminal. P-channel IGFET P310 may receive the output of inverter logic gate G310 at a gate terminal. In this way, pass gate PG300 may provide a controllable impedance path between the output of amplifier AMP300 and increment signal INC in response to the output of NOR logic gate G300.

Figure 4:
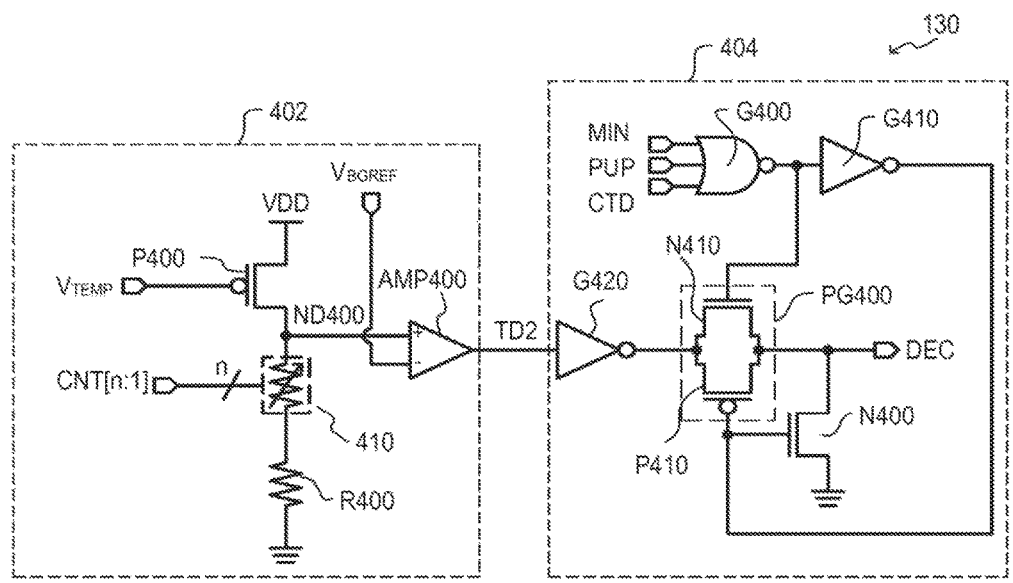
FIG. 4 is a circuit schematic diagram of a temperature sensing circuit according to an embodiment.

Referring now to FIG. 4, temperature sensor circuit 130 is set forth in a circuit schematic diagram. Temperature sensor circuit 130 may receive reference voltages ($V_{BGREF}$ and $V_{TEMP}$), count limit signal MIN, count transition signal CTD, power up signal PUP, and count value CNT[n:1] as inputs and may provide decrement signal DEC as an output.

Temperature sensor circuit 130 can include a temperature sensing portion 402 and a decrement signal output portion 404 Temperature sensing portion 402 can receive reference voltages ($V_{BGREF}$ and $V_{TEMP}$), and count value CNT[n:1] as inputs and may provide an temperature detect signal TD2 as an output. Decrement signal output portion 404 can receive temperature detect signal TD2, count limit signal MIN, count transition signal CTD, and power up signal PUP as inputs and may provide decrement signal DEC as an output.

Temperature sensing portion 402 can include a p-channel insulated gate field effect transistor (IGFET) P400, a variable resistor 410, a resistor R400, and an amplifier AMP400. Decrement signal output portion 404 can include a NOR logic gate G400, an inverter logic gate G410, a pass gate PG400, inverter logic gate G420, and an n-channel IGFET N400.

P-channel IGFET P400 may have a source terminal connected to a power supply potential VDD, a drain commonly connected to a first terminal of variable resistor 410 and a positive input terminal of amplifier AMP400 at node ND400, and a gate terminal connected to receive voltage $V_{TEMP}$. The potential of reference voltage $V_{TEMP}$ may change inversely to the change in the temperature of the semiconductor device 100. Variable resistor 410 may receive count value CNT[n:1] as inputs and may have a second terminal connected to a first terminal of resistor R400. Resistor R400 may have a second terminal connected to a ground potential. Amplifier AMP400 may have a negative input terminal connected to receive reference voltage $V_{BGREF}$. Reference voltage $V_{BGREF}$ may not vary with temperature and may have an essentially constant potential. Amplifier AMP400 may provide temperature detect signal TD2 as an output.

NOR logic gate G400 may receive count limit signal MIN, power up signal PUP, and count transition signal CTD as inputs and may provide an output. Inverter logic gate G410 may receive the output of NOR logic gate G400 at an input terminal and may provide an output. Inverter logic gate G420 may receive the output of amplifier AMP400 at an input terminal and may provide an output. Pass gate PG400 may receive the output of NOR logic gate G400 and inverter logic gate G410 as inputs and may provide a controllable impedance path between the output of inverter logic gate G420 and the decrement signal DEC. N-channel IGFET N400 may have a drain terminal connected to decrement signal DEC, a source connected to a ground potential and a gate terminal connected to receive the output of inverter logic gate G410.

Pass gate PG400 may include an n-channel IGFET N410 and a p-channel IGFET P410 having source/drain terminals connected in parallel between the output of inverter logic gate G420 and decrement signal DEC. N-channel IGFET N410 may receive the output of NOR logic gate G400 at a gate terminal. P-channel IGFET P410 may receive the output of inverter logic gate G410 at a gate terminal. In this way, pass gate PG400 may provide a controllable impedance path between the output of inverter logic gate G420 and decrement signal DEC in response to the output of NOR logic gate G400.

Temperature sensor circuit 120 may provide a temperature range upper limit value based on the count value CNT[n:1] and temperature sensor circuit 130 may provide a temperature range lower limit value based on the count value CNT[n:1]. Increment signal INC may transition from a low logic level to a high logic level in response to the temperature of semiconductor device 100 transitioning from within the temperature range to the temperature range upper limit value. Decrement signal DEC may transition from a low logic level to a high logic level in response to the temperature of semiconductor device 100 transitioning from within the temperature range to the temperature range lower limit value.

Figure 5:
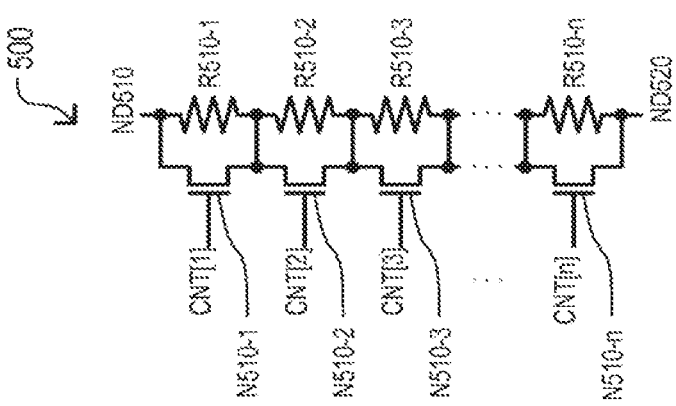
FIG. 5 is a circuit schematic diagram of a variable resistor according to an embodiment.

Referring now to FIG. 5, a variable resistor according to an embodiment is set forth in a block schematic diagram and given the general reference character 500. Variable resistor 500 may be used as variable resistor 310 or variable resistor 410 in temperature sensor circuits (120 and 130), respectively.

Variable resistor 500 may include resistors (R510-1 to R510-n) connected in series. Resistor R510-1 may have a first terminal connected to voltage dividing node ND510 (corresponding to a node ND300 for temperature sensing circuit 120 and a node ND400 for temperature sensing circuit 130). Resistor R510-1 may have a second terminal connected to a first terminal of resistor R510-2. Resistor R510-2 may have a second terminal connected to resistor R510-3. This series connection may be repeated until the last resistor R510-n may have a second terminal connected to node N520 (corresponding to the second terminal of resistor R300 in temperature sensor circuit 120 and the second terminal of resistor R400 in temperature sensor circuit 130).

Variable resistor 500 may include transistors (N510-1 to N510-n). Each transistor (N510-1 to N510-n) has a drain connected to a first terminal of a resistor (R510-1 to R510-n), respectively, and a source connected to a second terminal of a resistor (R510-1 to R510-n), respectively. Each transistor (N510-1 to N510-n) receives a respective count value bit CNT[1] to CNT[n] at a respective gate terminal.

Transistors (N510-1 to N510-n) may be n-channel IGFETs, for example.

Transistors (N510-1 to N510-n) can each form a shunt for a respective resistor (R510-1 to R510-n) when a respective count value bit CNT[1] to CNT[n] is at a high level (i.e., the respective transistor (N510-1 to N510-n) is turned on). When a respective count value bit (CNT[1] to CNT[n]) is at a low level, the respective transistor (N510-1 to N510-n) is turned off and the respective resistor (R510-1 to R510-n) is included in the resistance value of variable resistor 500. In this way, a resistance value for variable resistor 500 may be selected. The resistance value for variable resistor 500 may include the cumulative values of resistors (R510-1 to R510-n) not shunted by respective transistors (N510-1 to N510-n).

Resistors (R510-1 to R510-n) may respectively provide a binary coded decimal resistance value in response to count value (CNT[1] to CNT[n]), such that resistor R510-1 may have a resistance value of R, resistor R510-1 may have a resistance value of 2R, resistor R510-2 may have a resistance value of 4R, resistor R510-3 may have a resistance value of 8R, and so on, and resistor R510-n may have a resistance value of $(2^n)R$.

Figure 6:
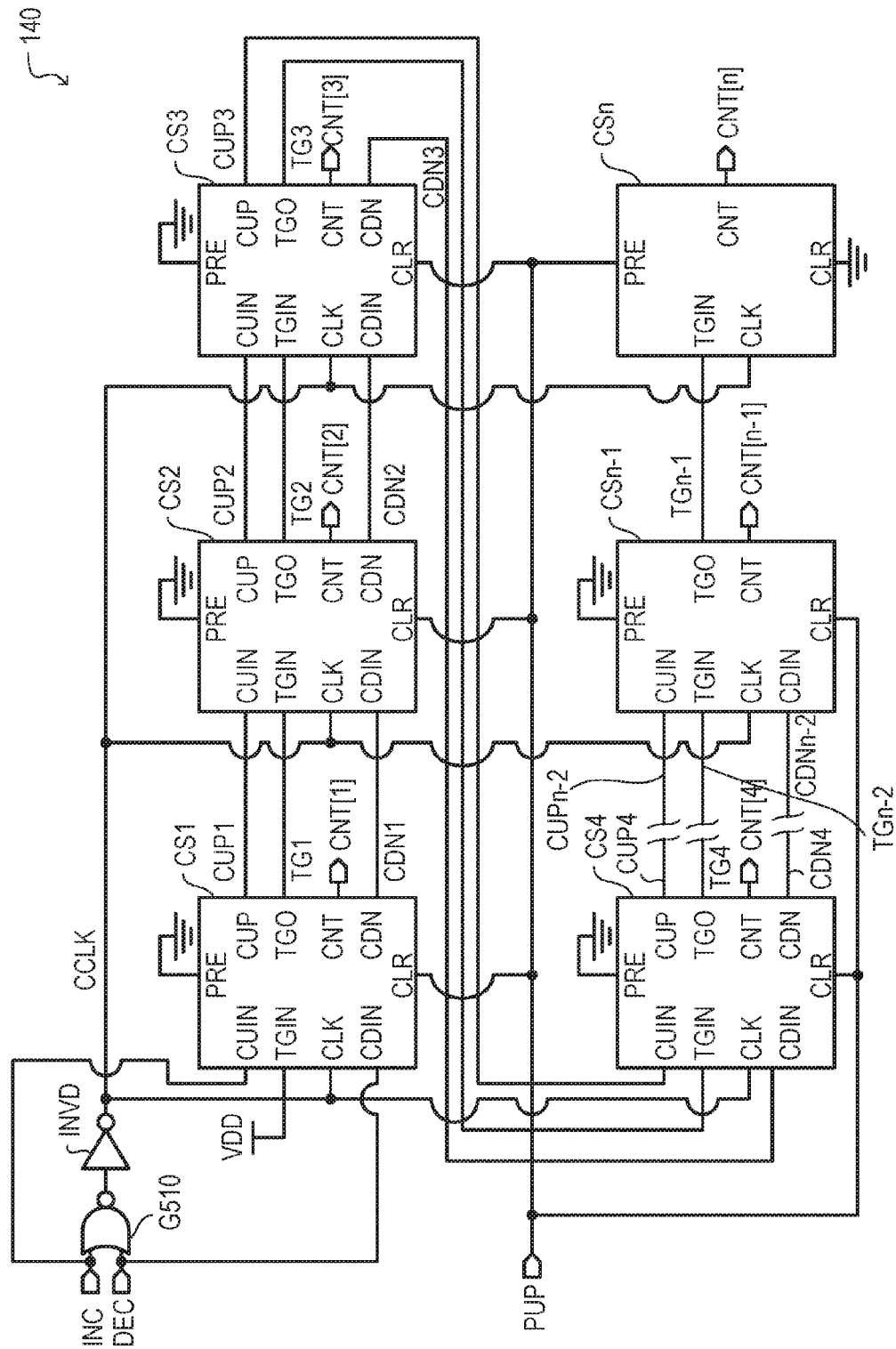
FIG. 6 is circuit schematic diagram of a counter circuit according to an embodiment.

Referring now to FIG. 6, a counter circuit 140 according to an embodiment is set forth in a circuit schematic diagram. Counter circuit 140 may receive increment signal INC, decrement signal DEC and power up signal PUP as inputs at input terminals and may provide count value bits (CNT[1] to CNT[n]) as outputs at output terminals. Counter circuit 140 may include a logic gate G510, a delay stage INVD, and counter cells (CS1 to CSn).

Logic gate G510 may receive increment and decrement signals (INC and DEC) as inputs and may provide an output. Logic gate G510 may be a NOR logic gate. Delay stage INVD may receive the output from logic gate G510 at an input terminal and may provide count clock signal CCLK at an output terminal. The propagation time delay of delay stage INVD may be sufficient to allow increment or decrement signal (INC and DEC) to propagate through counter stages (CS1 to CSn-1 to provide toggle signal TGn-1 as an input to counter stage CSn before counter clock signal CCLK is provided to incrementally change the value of count value CNT[n:1]).

Counter cell CS1 may receive increment signal INC at a count up input terminal CUIN, decrement signal DEC at a count down input terminal CDIN, power supply potential VDD at a toggle input terminal TGIN, and count clock signal CCLK at a clock input terminal CLK. Counter cell CS1 may receive a ground potential at a preset input terminal PRE and power up signal PUP at a clear input terminal CLR. Counter cell CS1 may provide a count up signal CUP1 at a count up output terminal CUP, a toggle signal TG1 at a toggle output terminal TGO, a count down signal CDN1 at a count down output terminal CDN, and a count value bit CNT[1] at a count bit output terminal CNT.

Counter cell CS2 may receive count up signal CUP1 at a count up input terminal CUIN, count down signal CDN1 at a count down input terminal CDIN, toggle signal TG1 at a toggle input terminal TGIN, and count clock signal CCLK at a clock input terminal CLK. Counter cell CS2 may receive a ground potential at a preset input terminal PRE and power up signal PUP at a clear input terminal CLR. Counter cell CS2 may provide a count up signal CUP2 at a count up output terminal CUP, a toggle signal TG2 at a toggle output terminal TGO, a count down signal CDN2 at a count down output terminal CDN, and a count value bit CNT[2] at a count bit output terminal CNT.

Counter cell CS3 may receive count up signal CUP2 at a count up input terminal CUIN, count down signal CDN2 at a count down input terminal CDIN, toggle signal TG2 at a toggle input terminal TGIN, and count clock signal CCLK at a clock input terminal CLK. Counter cell CS3 may receive a ground potential at a preset input terminal PRE and power up signal PUP at a clear input terminal CLR. Counter cell CS3 may provide a count up signal CUP3 at a count up output terminal CUP, a toggle signal TG3 at a toggle output terminal TGO, a count down signal CDN3 at a count down output terminal CDN, and a count value bit CNT[3] at a count bit output terminal CNT.

Counter cell CS4 may receive count up signal CUP3 at a count up input terminal CUIN, count down signal CDN3 at a count down input terminal CDIN, toggle signal TG3 at a toggle input terminal TGIN, and count clock signal CCLK at a clock input terminal CLK. Counter cell CS4 may receive a ground potential at a preset input terminal PRE and power up signal PUP at a clear input terminal CLR. Counter cell CS4 may provide a count up signal CUP4 at a count up output terminal CUP, a toggle signal TG4 at a toggle output terminal TGO, a count down signal CDN4 at a count down output terminal CDN, and a count value bit CNT [4] at a count bit output terminal CNT.

Counter cell CSn-1 may receive count up signal CUPn-2 at a count up input terminal CUIN, count down signal CDNn-2 at a count down input terminal CDIN, toggle signal TGn-2 at a toggle input terminal TGIN, and count clock signal CCLK at a clock input terminal CLK. Counter cell CSn-1 may receive a ground potential at a preset input terminal PRE and power up signal PUP at a clear input terminal CLR. Counter cell CSn-1 may provide a toggle signal TGn-1 at a toggle output terminal TGO, and a count value bit CNT[n-1] at a count bit output terminal CNT.

Counter cell CSn may receive toggle signal TGn-1 at a toggle input terminal TGIN, and count clock signal CCLK at a clock input terminal CLK. Counter cell CSn may receive a ground potential at a clear input terminal CLR and power up signal PUP at a preset input terminal PRE. Counter cell CSn may provide a count value bit CNT[n] at a count value output terminal CNT.

It is understood that there may be any number of counter cells CS disposed in series between counter cell CS4 and CSn−1 to provide a predetermined number "n" of count bits.

Referring now to FIGS. 7a to 7c, counter cells according to an embodiment are set forth in circuit schematic diagrams and given the general reference characters 700a to 700c, respectively.

Counter cell 700a may include count up input terminal CUIN, preset input terminal PRE, toggle input terminal TGIN, clear input terminal CLR, count down input terminal CDIN, and clock input terminal CLK. Counter cell 700a may further include count bit output terminal CNT, count up output terminal CUP, toggle output terminal TGO, and count down output terminal CDN.

Counter cell 700a may be used as counter cells (CS1 to CS4) in counter circuit 140 of FIG. 6.

Counter cell 700a may include a flip-flop circuit 710a, and logic gates (G710a, G720a, G730a, G740a, and G750a).

Flip-flop circuit 710a may have commonly connected input terminals (J and K) connected to receive an input signal at toggle input terminal TGIN. Flip-flop circuit 710a may receive clock input terminal CLK at a flip-flop clock input terminal CLKF, preset input terminal PRE at a flip-flop preset input terminal PREF, and clear input terminal CLR at a flip-flop clear input terminal CLRF. Flip-flop circuit 710a may include output terminals (Q and/Q). Output terminal Q may be connected to count bit output terminal CNT to provide a count value bit. Flip-flop circuit 710a may be a J-K flip flop circuit.

Logic gate G710a may have a first input terminal connected to receive a signal from count up input terminal CDIN as an input signal and a second input terminal connected to receive a count value bit from count bit output terminal CNT. Logic gate G710a may provide an output signal at an output terminal. Logic gate G710a may be a NAND logic gate.

Logic gate G720a may have a first input terminal connected to receive an input signal from count down input terminal CDIN and a second input terminal connected to receive a complementary count value bit from output terminal/Q of flip-flop circuit 710a. Logic gate G720a may provide an output signal at an output terminal. Logic gate G720a may be a NAND logic gate.

Logic gate G730a may receive an output from logic gate G710a at an input terminal and may provide an output signal to count up output terminal CUP. Logic gate G730a may be an inverter logic gate.

Logic gate G740a may have a first input terminal connected to receive an output signal from logic gate 710a and a second input terminal connected to receive an output signal from logic gate 720a. Logic gate G740a may provide an output signal to toggle output terminal TGO. Logic gate G740a may be a NAND logic gate.

Logic gate G750a may receive an output from logic gate G720a at an input terminal and may provide an output signal to count down output terminal CDN. Logic gate G750a may be an inverter logic gate.

Counter cell 700b may be used as counter cell CSn−1 in counter circuit 140 of FIG. 6.

Counter cell 700b may include a flip-flop circuit 710b, and logic gates (G710b, G720b, and G730b).

Flip-flop circuit 710b may have commonly connected input terminals (J and K) connected to receive an input signal at toggle input terminal TGIN. Flip-flop circuit 710b may receive clock input terminal CLK at a flip-flop clock input terminal CLKF, preset input terminal PRE at a flip-flop preset input terminal PREF, and clear input terminal CLR at a flip-flop clear input terminal CLRF. Flip-flop circuit 710b may include output terminals (Q and/Q). Output terminal Q may be connected to count bit output terminal CNT to provide a count value bit. Flip-flop circuit 710b may be a J-K flip flop circuit.

Logic gate G710b may have a first input terminal connected to receive a signal from count up input terminal CUIN as an input signal and a second input terminal connected to receive a count value bit from count bit output terminal CNT. Logic gate G710b may provide an output signal at an output terminal. Logic gate G710b may be a NAND logic gate.

Logic gate G720b may have a first input terminal connected to receive an input signal from count down input terminal CDIN and a second input terminal connected to receive a complementary count value bit from output terminal/Q of flip-flop circuit 710b. Logic gate G720b may provide an output signal at an output terminal. Logic gate G720b may be a NAND logic gate.

Logic gate G730b may have a first input terminal connected to receive the output signal from logic gate G710b and a second input terminal connected to receive the output signal from logic gate G720b. Logic gate G730b may provide an output signal to toggle output terminal TGO. Logic gate G730b may be a NAND logic gate.

Counter cell 700c may be used as counter cell CSn in counter circuit 140 of FIG. 6.

Counter cell 700c may include a flip-flop circuit 710c.

Flip-flop circuit 710c may have commonly connected input terminals (J and K) connected to receive an input signal at toggle input terminal TGIN. Flip-flop circuit 710c may receive clock input terminal CLK at a flip-flop clock input terminal CLKF, preset input terminal PRE at a flip-flop preset input terminal PREF, and clear input terminal CLR at a flip-flop clear input terminal CLRF. Flip-flop circuit 710c may include output terminals (Q and/Q). Output terminal Q may be connected to count bit output terminal CNT to provide a count value bit. Flip-flop circuit 710c may be a J-K flip flop circuit.

Figure 8:
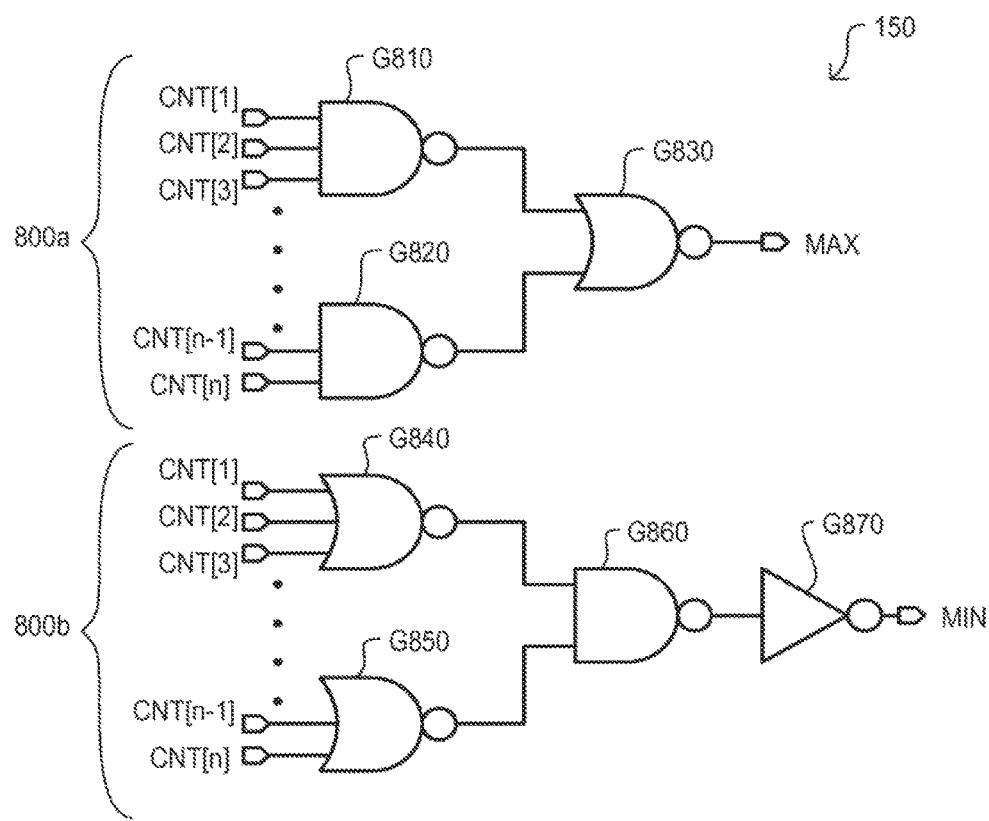
FIG. 8 is a circuit schematic diagram of a count limit detector according to an embodiment.

Referring now to FIG. 8, count limit detector 150 is set forth in a circuit schematic diagram.

Count limit detector 150 may include a maximum count limit circuit 800a and a minimum count limit circuit 800b.

Maximum count limit circuit 800a can receive count value CNT[n:1] as inputs and provide count limit signal MAX as an output. Maximum count limit circuit 800a can include logic gate circuits (G810, G820, and G830).

Logic gate circuit G810 can receive count value bits (CNT[1], CNT[2], and CNT[3]) at input terminals and may provide an output signal at an output terminal. Logic gate circuit G810 may be a NAND logic gate circuit.

Logic gate circuit G820 can receive count value bits (CNT[n−1] and CNT[n]) at input terminals and may provide an output signal at an output terminal. Logic gate circuit G820 may be a NAND logic gate circuit.

Logic gate circuit G830 can receive the output signal of logic gate circuit G810 at a first input terminal and output signal of logic gate circuit G820 at a second input terminal and may provide count limit signal MAX at an output terminal. Logic gate circuit G830 may be a NOR logic gate circuit.

Minimum count limit circuit 800b can receive count value CNT[n:1] as inputs and provide count limit signal MIN as an output. Maximum count limit circuit 800*b* can include logic gate circuits (G840, G850, G860, and G870).

Logic gate circuit G840 can receive count value bits (CNT[1], CNT[2], and CNT[3]) at input terminals and may provide an output signal at an output terminal. Logic gate circuit G840 may be a NOR logic gate circuit.

Logic gate circuit G850 can receive count value bits (CNT[n−1] and CNT[n]) at input terminals and may provide an output signal at an output terminal. Logic gate circuit G850 may be a NOR logic gate circuit.

Logic gate circuit G860 can receive the output signal of logic gate circuit G840 at a first input terminal and output signal of logic gate circuit G850 at a second input terminal and may provide an output signal at an output terminal. Logic gate circuit G860 may be a NAND logic gate circuit.

Logic gate circuit G870 can receive the output signal of logic gate circuit G860 at an input terminal and may provide count limit signal MIN at an output terminal. Logic gate circuit G870 may be an inverter logic gate circuit.

It is understood that there may be a predetermined similar logic gates interposed between logic gates (G810 and G820) to accommodate any number of bits in count value CNT[n:1] such that maximum count limit circuit 800*a* performs a logic AND of count value CNT[n:1]. Likewise, it is understood that there may be a predetermined similar logic gates interposed between logic gates (G840 and G850) to accommodate any number of bits in count value CNT[n:1] such that minimum count limit circuit 800*b* performs a logic NOR of count value CNT[n:1].

Figure 9:
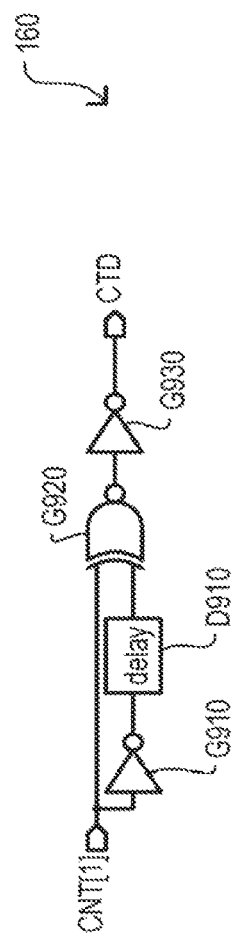
FIG. 9 is circuit schematic diagram of a transition detector according to an embodiment.

Referring now to FIG. 9, transition detector 160 is set forth in a circuit schematic diagram.

Transition detector 160 may receive the least significant bit CNT[1] from count value CNT[n:1] as an input and may provide a count transition signal CTD as an output.

Transition detector 160 may include logic gate circuits (G910, G920, and G930) and a delay circuit D910.

Logic gate circuit G910 can receive the least significant bit CNT[1] from count value CNT[n:1] at an input terminal and may provide an output to an output terminal. Logic gate circuit G910 may be an inverter circuit.

Delay circuit D910 may receive the output of logic gate circuit G910 at an input terminal and may provide an output at an output terminal. Delay circuit D910 may delay both the rising edge and the falling edge of the output from logic gate circuit G910 to provide a delayed signal at the output terminal of delay circuit D910.

Logic gate circuit G920 may receive the least significant bit CNT[1] from count value CNT[n:1] at a first input terminal and the delayed signal provided at the output terminal of delay circuit D910 at a second input terminal and may provide an output at an output terminal. Logic gate circuit G920 may be an exclusive NOR (XNOR) circuit.

Logic gate circuit G930 can receive the output of logic gate circuit G920 at an input terminal and may provide count transition signal CTD an output terminal. Logic gate circuit G930 may be an inverter circuit.

The operation of transition detector 160 will now be discussed. When least significant bit CNT[1] from count value CNT[n:1] is at a low logic level, the first input of logic gate circuit G920 is at a logic low level and the second input terminal of logic gate circuit G920 is at a logic high level. In this case, the output of logic gate circuit G920 (XNOR gate) is a logic high. With the output of logic gate circuit G920 at a logic high, the output of logic gate circuit G930 (inverter) is a logic low. In this way, count transition signal CTD may be a logic low level. When the least significant bit CNT[1] from count value CNT[n:1] transitions from a logic low level to a logic high level, the first input terminal of logic gate circuit G920 is at a logic high level. At this time, the logic transition has not propagated through delay circuit D910 and the second input terminal of logic gate circuit G920 remains at a logic high level. With both input terminals of logic gate circuit G920 (XNOR gate) at a logic high level, the output of logic gate circuit G920 may transition to a logic low level and the output of logic gate circuit G930 (an inverter) may be a logic high level. After the logic transition propagates through, delay circuit D910, the second input terminal of logic gate G920 may transition to a logic low level. With the first input terminal of logic gate circuit G920 at a logic high level and the second input terminal at a logic low level, the output of logic gate circuit G920 may transition to a logic high level and the output of logic gate G930 may transition to a logic low level. In this way, count transition signal CTD may be a pulse generated in response to a transition in the least significant bit CNT[1] from count value CNT[n:1]. The pulse width of count transition signal CTD may be essentially determined by the propagation delay of delay circuit D910. In a similar manner, transition detector 160 can generate a count transition signal CTD having a pulse in response to a high to low logic transition of least significant bit CNT[1] from count value CNT[n:1].

Figure 10:
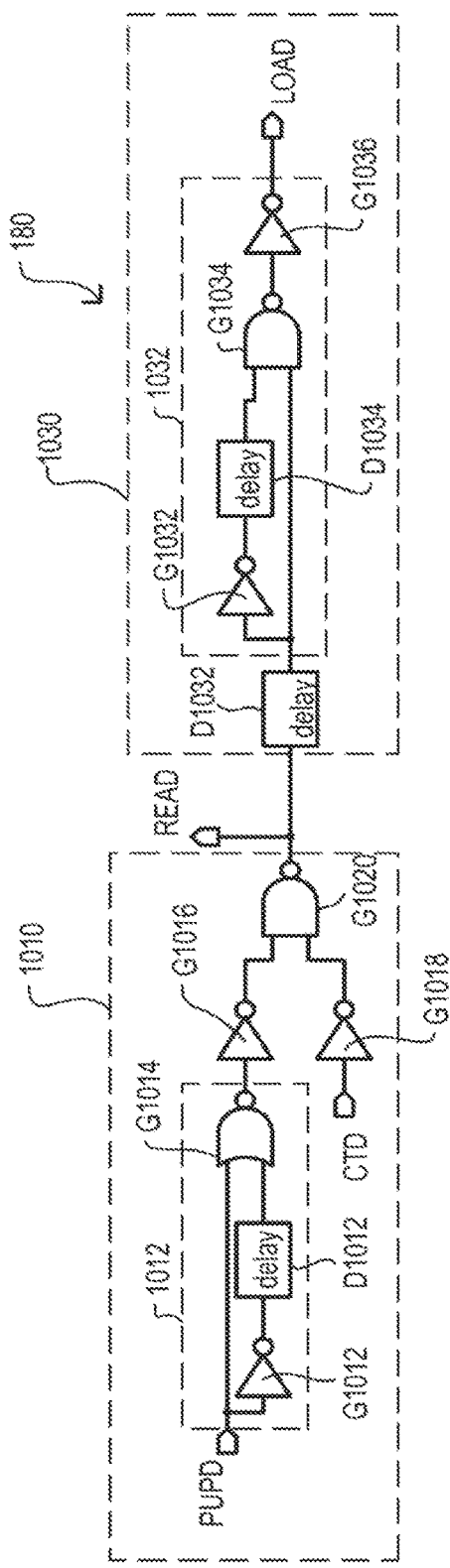
FIG. 10 is a circuit schematic diagram of a control circuit according to an embodiment.

Referring now to FIG. 10, a control circuit 180 is set forth in a circuit schematic diagram. Control circuit 180 can be used as control circuit 180 in semiconductor device 100 of FIG. 1.

Control circuit 180 may receive power up signal PUPD and count transition signal CTD at input terminals and may provide read signal READ and load signal LOAD as outputs at respective output terminals.

Control circuit 180 may include a read generating circuit 1010 and a load generating circuit 1030. Read generating circuit 1010 may receive power up signal PUPD and count transition signal CTD at input terminals and may provide read signal READ at an output terminal. Load generating circuit 130 may receive read signal READ at an input terminal and may provide load signal LOAD at an output terminal.

Read generating circuit 1010 may include pulse generating circuit 1012 and logic gates (G1016, G1018, and G1020). Pulse generating circuit 1012 may receive power up signal PUPD as an input and may provide a pulse output at an output terminal. Logic gate G1016 may receive the pulse output of pulse generating circuit 1012 at an input terminal and may provide an output to an output terminal. Logic gate G1016 may be an inverter circuit. Logic gate G1018 may receive count transition signal CTD at an input terminal and may provide an output to an output terminal. Logic gate G1018 may be an inverter circuit. Logic gate G1020 may receive the output of logic gate G1016 at a first input terminal and the output of logic gate G1018 at a second input terminal and may provide read signal READ at an output terminal. Logic gate G1020 may be a NAND logic gate.

Load generating circuit 1030 can include delay circuit D1032 and pulse generating circuit 1032. Delay circuit D1032 may receive read signal READ at an input terminal and may provide an output at an output terminal. Pulse generating circuit 1032 may receive the output of delay circuit D1032 at an input terminal and may provide load signal LOAD at an output terminal.

Pulse generating circuit 1032 can include logic gates (G1032, G1034, and G1036) and delay circuit D1034. Logic gate G1032 may receive the output of delay circuit at an input terminal and may provide an output at an output terminal. Logic gate G1032 may be an inverter logic gate. Delay circuit D1032 may receive the output of logic gate G1032 at an input terminal and may provide an output at an output terminal. Logic gate G1034 can receive the output of delay circuit D1034 at a first input terminal and the output of delay circuit D1032 at a second input terminal and may provide an output at an output terminal. Logic gate G1034 may be a NAND logic gate. Logic gate G1036 may receive the output of logic gate G1034 at an input terminal and may provide load signal LOAD at an output terminal.

The operation of control circuit 180 will now be explained. Pulse generating circuit 1012 may create a logic high pulse in response to power up signal PUPD transitioning from a logic high to a logic low level. When the pulse output of pulse generating circuit 1012 is high, the output of logic gate G1016 will be at a logic low. With the output of logic gate G1016 at a logic low level, read signal READ may be at a logic high. Read signal READ may be a logic high pulse having a pulse width essentially determined by the propagation delay of delay circuit D1012 generated in response to power up signal PUPD transitioning from a logic high to a logic low level. Otherwise, read signal READ may be generated as a pulse signal (logic high pulse) in response to the count transition signal CTD (via logic gate (G1018 and G1020)). In this case, the pulse width of read signal READ may essentially be set by the propagation delay of delay circuit D910 in count transition detector D160.

Read signal READ may propagate through delay circuit D1032. When a low to high transition read signal READ propagates through delay circuit D1032, pulse generator 1032 in load signal generating circuit 1030 may provide a high going pulse for load signal LOAD. In this way, load signal LOAD may be a high going pulse generated a predetermined delay after the read signal transitions from low to high. The predetermined delay can be essentially the propagation delay of delay circuit D1032 and the pulse width of load signal LOAD may be essentially the propagation delay of delay circuit D1034 in pulse generating circuit 1032.

Figure 11:
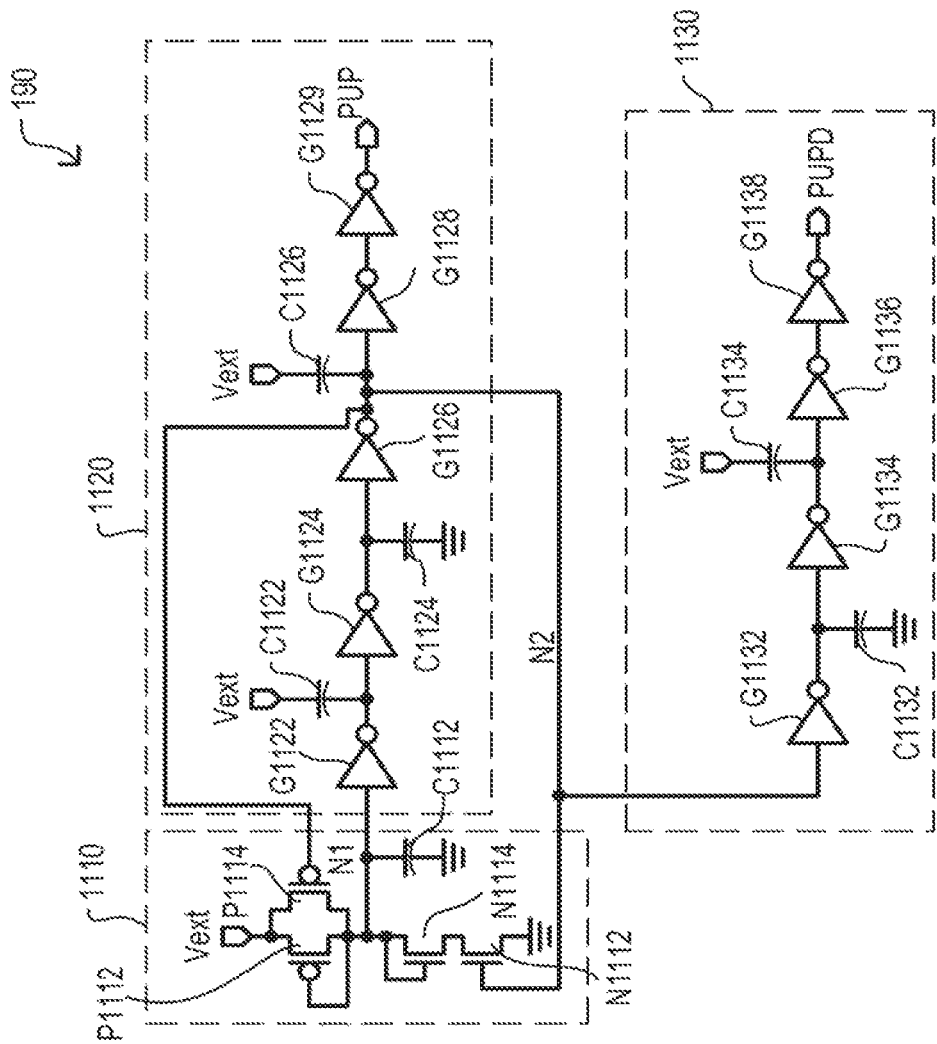
FIG. 11 is a circuit schematic diagram of a power up circuit according to an embodiment.

Referring now to FIG. 11, a power up circuit 190 is set forth in a circuit schematic diagram.

Power up circuit 190 may generate power up signals (PUP and PUPD) in response to a detection of a power supply Vext being energized to a predetermined potential.

Power up circuit 190 may include a charging circuit 1110, a first power up signal generating circuit 1120 and a second power up signal generating circuit 1130. Charging circuit 1110 can receive power supply Vext and a feedback node N2 as inputs and may provide an output at a charge node N1. First power up signal generating circuit 1120 may have an input terminal connected to charge node N1 and may provide an output at feedback node N2 and power up signal PUP at an output terminal. Second power up signal generating circuit 1130 may receive feedback node N2 at an input terminal and may provide power up signal PUPD at an output terminal.

Charging circuit 1110 can include p-channel IGFETs (P1112 and P1114), n-channel IGFETs (N1112 and N1114), and a capacitor C1112. P-channel IGFET P1112 may receive a power supply Vext at a source terminal and may have gate and drain terminals commonly connected to a charge node N1. P-channel IGFET P1114 may receive power supply Vext at a source terminal, feedback node N2 at a gate terminal, and may have a drain terminal connected to charge node N1. N-channel IGFET N1112 may receive a ground reference potential at a source terminal, feedback node N2 at a gate terminal, and may have a drain terminal commonly connected to the source terminal of n-channel IGFET N1114. N-channel IGFET N1114 may have drain and gate terminals commonly connected to charge node N1.

First power up signal generating circuit 1120 can include logic gates (G1122, G1124, G1126, G1128, and G1129) and capacitors (C1122, C1124, and C1126). Logic gate G1122 may have an input terminal connected to charge node N1 and an output terminal commonly connected to a first terminal of capacitor C1122 and an input terminal of logic gate G1124. Capacitor C1122 may have a second terminal connected to power supply Vext. Logic gate G1124 may have an output terminal commonly connected to a first terminal of capacitor C1124 and an input terminal of logic gate G1126. Capacitor C1124 may have a second terminal connected to a ground reference potential. Logic gate G1126 may have a second terminal connected to feedback node N2. Capacitor C1126 may have a first terminal connected to feedback node N2 and a second terminal connected to power supply Vext. Logic gate G1128 can have an input terminal connected to feedback node N2 and an output terminal connected to an input terminal of logic gate G1129. Logic gate G1129 may provide power up signal PUP at an output terminal. Logic gates (G1122, G1124, G1126, G1128, and G1129) may be inverter circuits.

Second power up signal generating circuit 1130 may include (G1132, G1134, G1136, and G1138) and capacitors (C1132 and C1134). Logic gate G1132 may have an input terminal connected to feedback node N2 and an output terminal commonly connected to a first terminal of capacitor C1132 and an input terminal of logic gate G1134. Capacitor C1122 may have a second terminal connected to a ground reference potential. Logic gate G1134 can an output terminal commonly connected to a first terminal of capacitor C1134 and an input terminal of logic gate G1136. Capacitor C1134 may have a second terminal connected to power supply Vext. Logic gate G1136 can have an output terminal connected to an input terminal of logic gate G1138. Logic gate G1138 may provide power up signal PUPD at an output terminal. Logic gates (G1132, G1134, G1136, and G1138) may be inverter circuits.

The operation of power up circuit 190 will now be explained. When semiconductor device 100 becomes powered up, a power supply Vext may transition from a discharged potential (i.e. ground) to a charged potential (i.e. the operating potential). Power up circuit 190 generates power up signals (PUP and PUPD) in response to this potential transition. When power supply Vext rises, capacitors (C1122, C1126, and C1134) may pull connected nodes toward the potential of power supply Vext, while capacitors (C1112, C1124, and C1132) may essentially, keep their connected nodes at the ground potential. With feedback node N2 at essentially, a potential of power supply Vext, power up signal PUP may be at a high logic level and with the node connected to capacitor C1134 at essentially, a potential of power supply Vext, power up signal PUPD may be at a high logic level. Furthermore, n-channel IGFET N1112 in charging circuit 1110 may be turned on and p-channel IGFET P1114 may be turned off. In this way, a current path may be enabled through series connected p-channel IGFET P1112, n-channel IGFET N1114, and n-channel IGFET N1112 to provide charge to charge node N1. Charge node N1 charges slowly, however once charge node N1 reaches to a threshold voltage (i.e. trip point) of logic gate G1122 (inverter) in first power up signal generating circuit 1120, capacitor C1122 may begin discharging toward a ground potential. Once the potential of capacitor C1122 reaches to a threshold voltage of logic gate G1124 (inverter) in first power up signal generating circuit 1120, capacitor C1124 may begin charging toward the potential of power supply Vext. This may continue until capacitor C1126 reaches a threshold voltage of logic gate G1128, in which power up signal PUP may transition from a logic high to a logic low level. Also, at this time, p-channel IGFET P1114 in charging circuit 1110 may turn on and n-channel IGFET N1114 may turn off to eliminate the current path from supply potential Vext and the ground potential.

A propagation delay later (determined by charging capacitor C1132 and discharging capacitor C1134 in second power up signal generating circuit 1130), power up signal PUPD may transition from a logic high to a logic low level.

In this way, power up circuit 190 may generate power up signals PUP and PUPD in response to semiconductor device 100 initially receiving an operating power supply potential.

Figure 12:
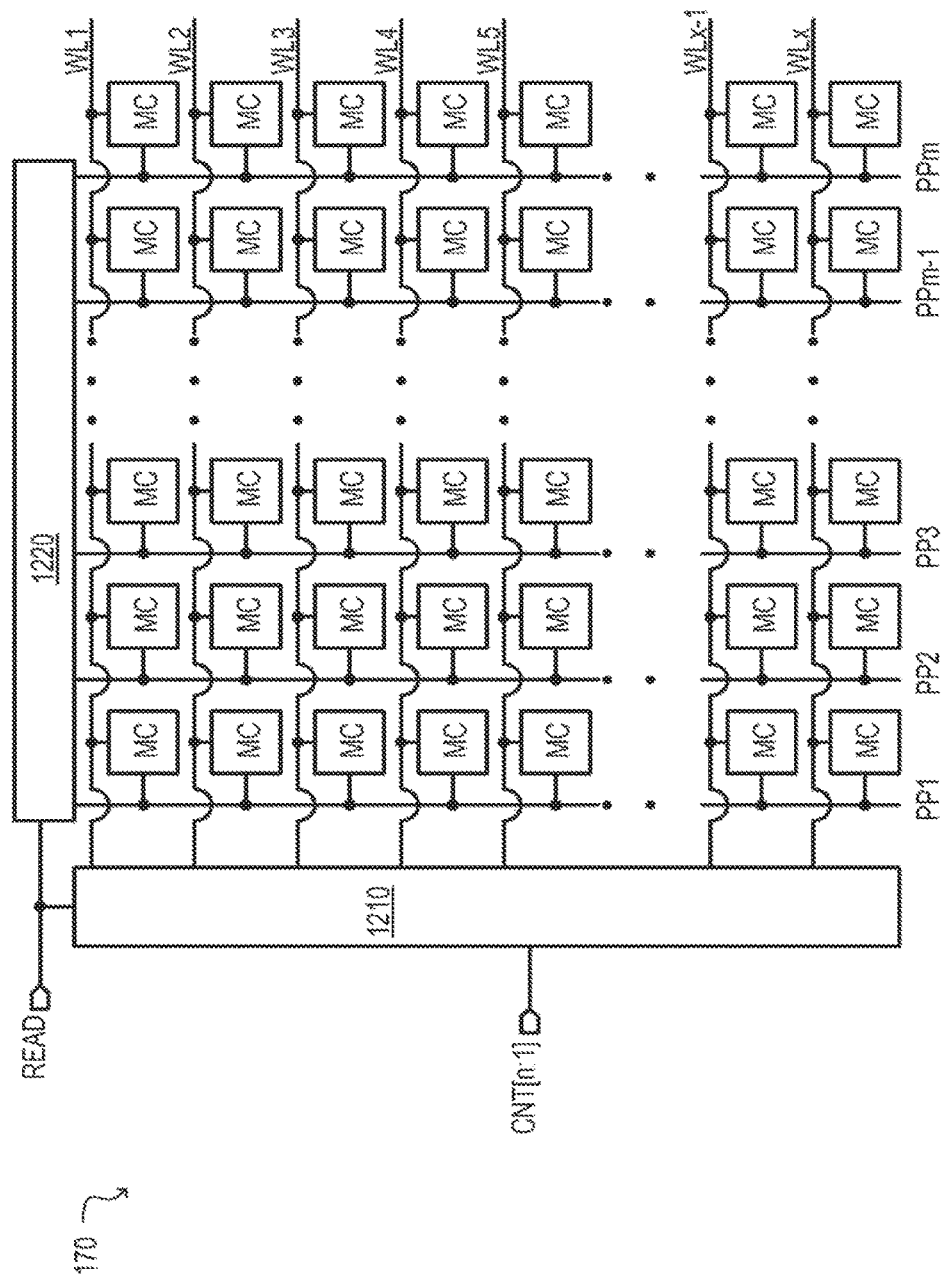
FIG. 12 is a circuit schematic diagram of a performance parameter table according to an embodiment.

Referring now to FIG. 12, performance parameter table 170 is set forth in a circuit schematic diagram.

Performance parameter table 170 may receive count value (CNT[1] to CNT[n]) and a read signal READ as inputs and may provide performance parameters (PP1 to PPm) as an output. Performance parameters (PP1 to PPm) may include m bits. Performance parameter table 170 may be a non-volatile memory array providing performance parameters (PP1 to PPm) in accordance to an address corresponding to the value of count value (CNT[1] to CNT[n]) in response to read signal READ.

Performance parameter table 170 may include a row selection circuit 1210, a precharge circuit 1220 and an array of memory cells MC.

Row selection circuit 1210 may be enabled by read signal READ to activate a predetermined word line (WL1 to WLx, where x=2$^n$) in response to the value of count value (CNT[1] to CNT[n]). Precharge circuit 1220 may be activated to drive each column line (providing performance parameters (PP1 to PPm)) to a first logic level in response to read signal READ being in an inactive state and may be disabled to allow a selected row of memory cells MC to drive respective column lines when the predetermined word line (WL1 to WLx, where x=2$^n$) is activated. In this way, programmed values in a row of memory cells MC may be used to provide a predetermined value to performance parameters (PP1 to PPm).

Figure 13:
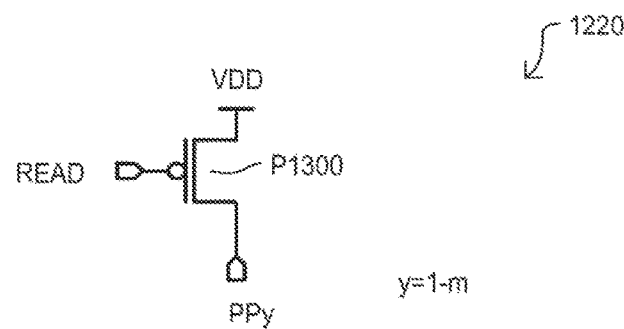
FIG. 13 is a circuit schematic diagram of a precharge circuit according to an embodiment.

Referring now to FIG. 13, a circuit schematic diagram of precharge circuit 1220 is set forth in a circuit schematic diagram.

Precharge circuit 1220 can include a p-channel IGFET P1300 for each column line (providing performance parameters (PP1 to PPm)) in performance parameter table 170. P-channel IGFET P1300 may have a source terminal connected to a power supply potential VDD, a drain terminal connected to a respective column line (PPy, where y=1-m) and a gate terminal connected to receive read signal READ. Precharge circuit 1220 may provide a controllable impedance path between power supply potential VDD and a respective column line (PPy, where y=1-m) in response to read signal READ. Precharge circuit 1220 may provide a low impedance path between power supply potential VDD and a respective column line (PPy, where y=1-m) when read signal READ is in a first logic level (logic low), and a high impedance path between power supply potential VDD and a respective column line (PPy, where y=1-m) when read signal READ is in a second logic level (logic high).

Figure 14:
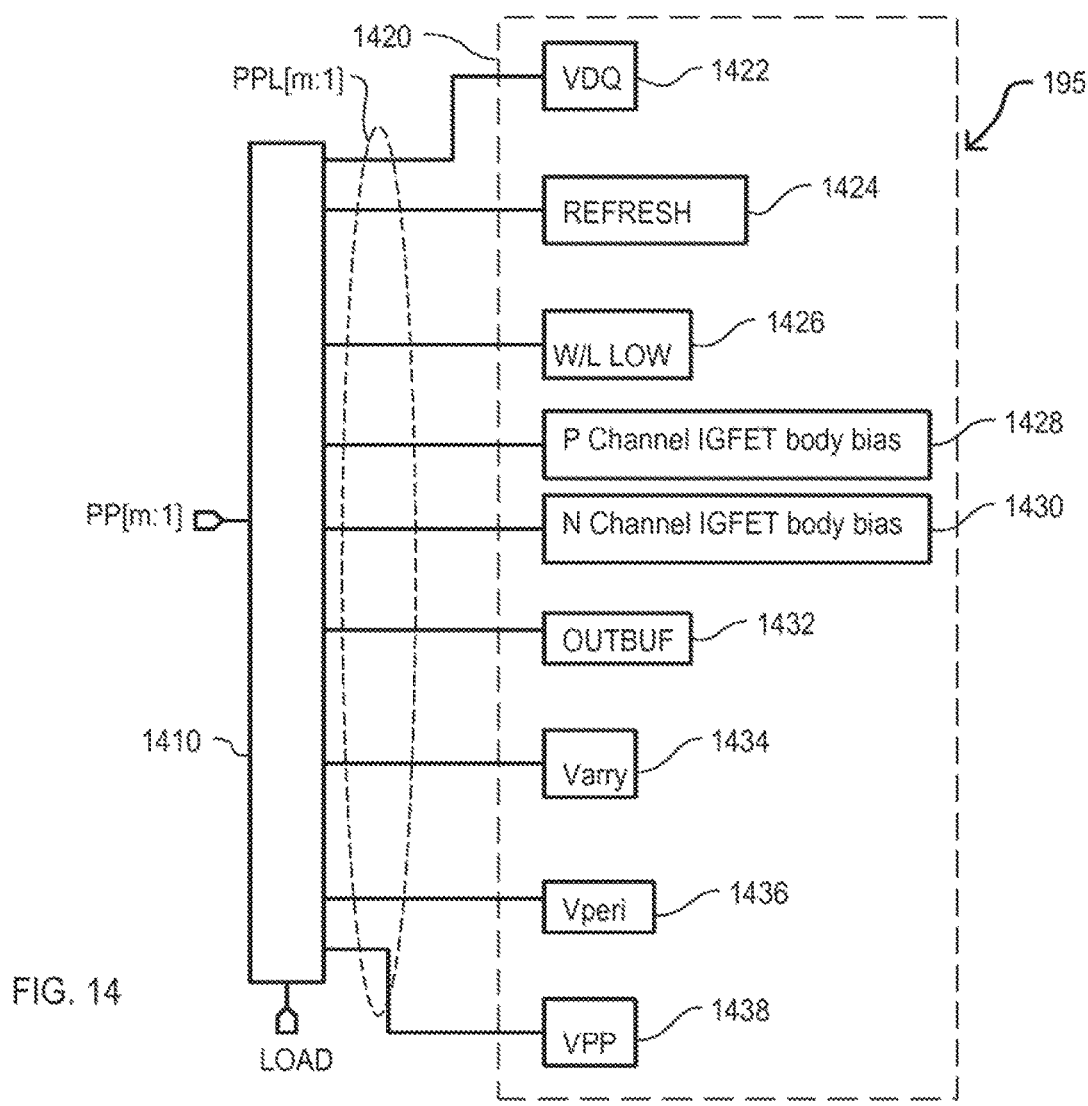
FIG. 14 is a block schematic diagram of operational circuits according to an embodiment.

Referring now to FIG. 14, operational circuits 195 are set forth in a block schematic diagram. Operational circuits can include registers 1410 and performance parameter adjusted (adjustable) circuits 1420. Performance parameter adjusted circuits 1420 may have operational aspects adjusted in accordance with latched performance parameters PPL[m:1] latched into registers 1420.

Registers 1410 may receive performance parameters PP[m:1] and load signal LOAD as inputs and may provide latched performance parameters PPL[m:1] as outputs. Performance parameter adjusted circuits 1420 may receive latched performance parameters PPL[m:1]. Performance parameter adjusted circuits 1420 may include a plurality of circuits. For example, performance parameter adjusted circuits 1420 can include an output buffer voltage generating circuit 1422, a DRAM refresh circuit 1424, a word line low potential generating circuit 1426, P-channel IGFET body bias potential generating circuit 1428, N-channel IGFET body bias potential generating circuit 1430, output buffer circuit 1432, an array potential generating circuit 1434, a peripheral potential generating circuit 1436 and a VPP generating circuit 1438.

It is understood that a unique plurality (subset) of latched performance parameters PPL[m:1] may be respectively provided to each performance parameter adjusted circuits 1420 including output buffer voltage generating circuit 1422, a DRAM refresh circuit 1424, a word line low potential generating circuit 1426, P-channel IGFET body bias potential generating circuit 1428, N-channel IGFET body bias potential generating circuit 1430, output buffer circuit 1432, array potential generating circuit 1434, peripheral potential generating circuit 1436 and VPP generating circuit 1438.

Figure 15:
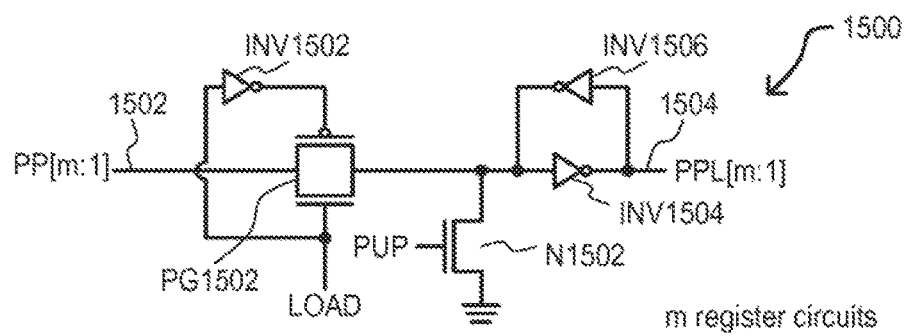
FIG. 15 is a circuit schematic diagram of a register circuit according to an embodiment.

Referring now to FIG. 15, a register circuit 1500 is set forth in a circuit schematic diagram.

There may be "m" register circuits 1500 comprising registers 1410 in operational circuit 195.

Each register circuit 1500 may receive a predetermined one of performance parameters PP[m:1], load signal LOAD, and power up signal PUP at input terminals and may provide a corresponding latched performance parameter PPL[m:1] at an output terminal.

Each register circuit 1500 may include inverters (INV1502, INV1504, and INV1506), a passgate PG1502, and an N-channel IGFET N1502.

Pass gate PG1502 may receive one of performance parameters PP[m:1] an input terminal 1502 at an input terminal and a load signal LOAD at a control input and may provide an output to an input of inverter INV1504. Inverter INV1502 may receive load signal LOAD and may provide an output to another control input terminal of pass gate PG1502. N-channel IGFET N1502 may have a source connected to ground, a drain connected to the input of inverter INV1504, and a gate connected to receive a power up signal PUP. Inverter INV1504 may provide an latched performance parameter PPL[m:1] to a terminal 1504. Inverter INV1506 may have an input connected to terminal 1504 and an output connected to the input of inverter INV1504 to form a latch.

The operation of register circuit 1500 will now be discussed. When a load operation occurs load signal LOAD pulses high. When load signal LOAD pulses high, the logic value at input node 1502 is passed through pass gate PG1502 to be latched in cross-coupled inverters (INV1506 and INV1504) and provided as latched performance parameter PPL[m:1] at output terminal 1504. When load signal returns to a low logic level, pass gate PG1502 is turned off and the value remains latched in cross-coupled inverters (INV1504 and INV1506). N-channel IGFET N1502 is provided to supply a known default value to register circuit 1500 on power up of semiconductor device 100. When power up occurs, power up detect signal PUP pulses high, thus turning on N-channel IGFET N1502 to provide a low logic level input to inverter INV1504. In this way, latched performance parameter PPL[m:1] may be powered up to a known state.

Figure 16:
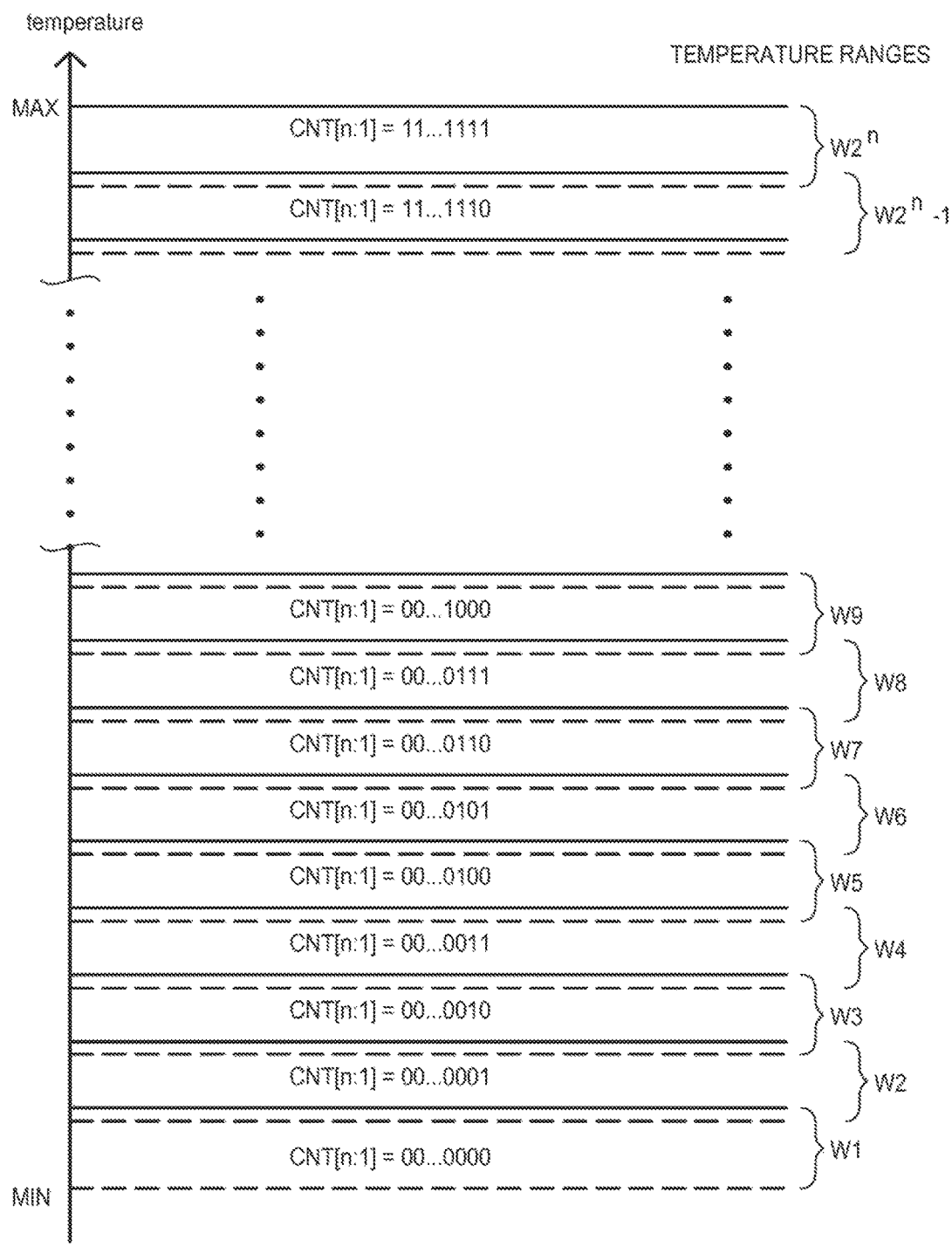
FIG. 16 is a diagram of a temperature ranges set by temperature sensor circuits according to an embodiment.

Referring now to FIG. 16, a diagram of temperature ranges set by temperature sensor circuits (120 and 130) according to an embodiment is set forth. The diagram of FIG. 16 illustrates the temperature ranges that can correspond to each count value CNT[n:1]. Each temperature range (W1 to W2$^n$, where n is the number of bits in count value CNT[n:1]) can include a temperature range upper limit value (illustrated by a solid line) and a temperature range lower limit value (illustrated by a dashed line). The temperature range upper limit value may be set by the count value CNT[n:1] by the resistance value of variable resistor 310 in temperature sensor circuit 120. The temperature range lower limit value may be set by the count value CNT[n:1] by the resistance value of variable resistor 410 in temperature sensor circuit 130. It is noted that each temperature range (W1 to W2$^n$) can overlap with an adjacent temperature range (W1 to W2$^n$). For example, the temperature range upper limit value of temperature range W5 can overlap the temperature range lower limit value of temperature range W6 and the temperature range lower limit value of temperature range W5 can overlap the temperature range upper limit value of temperature range W4. In other words, the temperature range upper limit value of temperature range W4 and the temperature range lower limit value of temperature range W6 can both fall within temperature range W5.

This overlap may be accomplished by selection of resistance values of resistors (R300 and R400) or temperature sensor circuits (120 and 130). For example, resistor R300 may have a resistance value that is between R510-1 and 1.5 times R510-1 greater than resistor R400. In other words, the resistance value of resistor R300 may be between the resistance value of resistor R400 plus the resistance value of resistor R510-1 and the resistance value of resistor R400 plus the 1.5 times the resistance value of resistor R510-1. Where resistor R510-1 has the resistance value of R in the binary coded decimal scheme set forth for variable resistor 500. In order to provide a more narrow overlap of temperature ranges, the resistance value of resistor R300 may be between the resistance value of resistor R400 plus the resistance value of resistor R510-1 and the resistance value of resistor R400 plus the 1.1 times the resistance value of resistor R510-1.

The each respective value of count value CNT[n:1] can set resistance values of variable resistors (310 and 410) so that the increment signal INC may transition from a low logic level to a high logic level when the temperature of the semiconductor device 100 transitions from within the set temperature range (W1 to W2$^n$) to the temperature range upper limit value and so that the decrement signal DEC may transition from a low logic level to a high logic level when the temperature of the semiconductor device 100 transitions from within the set temperature range (W1 to W2$^m$) to the temperature range lower limit value.

Having a unique value for the count value CNT[n:1] allows performance parameters PP[m:1] to be latched as latched performance parameters PPL[m:1] and provided to performance parameter adjusted circuits 1420. In this way, performance parameter adjusted circuits 1420 may functionally operate in each temperature range (W1 to W2$^n$) without the necessity of providing undue margin at one temperature of operation in order to satisfy another temperature of operation.

Temperature ranges (W1 to W2$^n$) may be conceptualized as temperature windows.

Figure 17:
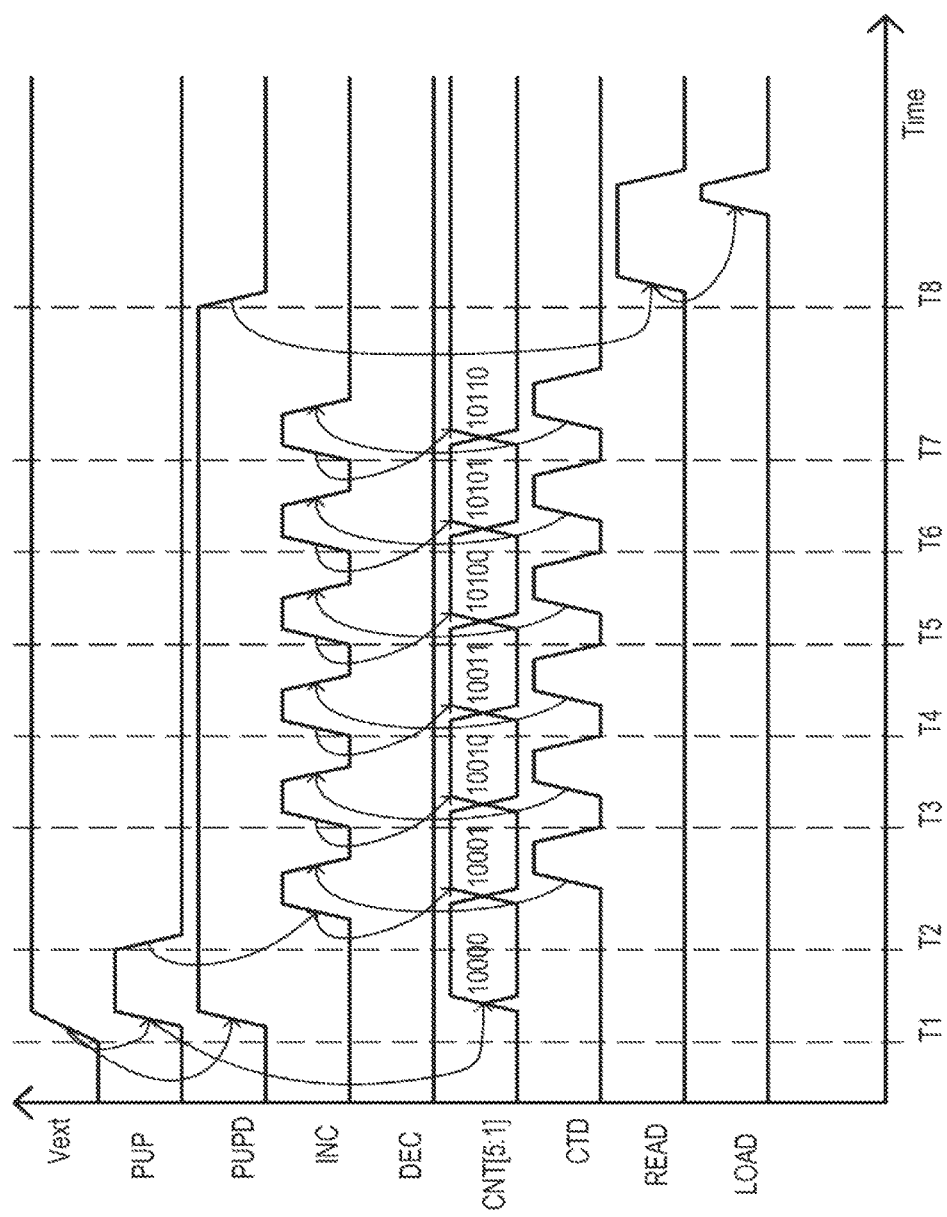
FIG. 17 is a waveform diagram illustrating the power up operation of a semiconductor device according to an embodiment.

Referring now to FIG. 17, a waveform diagram illustrating the power up operation of semiconductor device 100 according to an embodiment is set forth.

The waveform diagram of FIG. 17 includes power supply Vext, power up signal PUP, power up signal PUPD, increment signal INC, decrement signal DEC, count value CNT [5:1] (a 5-bit counter where n=5), count transition signal CTD, read signal READ, and load signal LOAD.

At an initial time, power may be turned off to semiconductor device 100 and power supply Vext may be low. With power supply Vext low, all signals, including power up signal PUP, power up signal PUPD, increment signal INC, decrement signal DEC, count value CNT[n:1], count transition signal CTD, read signal READ, and load signal LOAD may be at a logic low level.

At time T1, semiconductor device 100 may be energized and power supply Vext may transition to a high level.

Due to the capacitive coupling in power up circuit 190, power up signals (PUP and PUPD) may transition from a logic low level to a logic high level.

In response to power up signal PUP being at a logic high level, counter circuit 140 may have the most significant bit CNT[5] of count value CNT[5:1] preset to a logic high level and the other bits (CNT[4] to CNT[1]) of count value CNT[5:1] may be preset to a logic low level. The preset to a predetermined level may be accomplished in response to the connection of power up signal PUP and ground potential to preset terminals PRE and clear terminals CLR of JK flip-flop circuits (710a, 710b, and 710c). In this way, count value CNT[5:1] may be preset to a value of "10000" or essentially a midpoint of the ranges of values.

Also in response to power up signal PUP being a logic high level, temperature sensor circuits (120 and 130) may be disabled and increment signal INC and decrement signal DEC may be forcibly set to a logic low level.

In temperature sensor circuit 120 (FIG. 3), logic gate G300 may receive power up signal PUP having a logic high level. Because logic gate G300 is a NOR gate, the output of logic gate G300 may be low. In this way, the n-channel IGFET N310 and p-channel IGFET P310 of passgate PG300 may respectively receive a logic low level and logic high level and passgate PG300 may be turned off and in a high impedance state. N-channel IGFET N300 may receive a logic high level and may be turned on to provide a low impedance path from the output terminal producing increment signal INC and a ground potential. In this way increment signal INC may be forcibly set to a logic low level.

In temperature sensor circuit 130 (FIG. 4), logic gate G400 may receive power up signal PUP having a logic high level. Because logic gate G400 is a NOR gate, the output of logic gate G400 may be low. In this way, the n-channel IGFET N410 and p-channel IGFET P410 of passgate PG400 may respectively receive a logic low level and logic high level and passgate PG400 may be turned off and in a high impedance state. N-channel IGFET N400 may receive a logic high level and may be turned on to provide a low impedance path from the output terminal producing decrement signal DEC and a ground potential. In this way decrement signal DEC may be forcibly set to a logic low level.

Also at this time, each of the m register circuits 1500 (FIG. 15) may receive power up signal PUP at the gate of n-channel IGFET N1502. With power up signal PUP at a logic high, n-channel IGFET N1502 may provide a low impedance path between the input of inverter INV1504 and ground. In this way, each latched performance parameter PPL[m:1] may be forced to a logic high level during power up.

At time T2, after charge node N1 in power up circuit 190 (FIG. 11) reaches a trip point of inverter logic gate G1122 and propagates through series connected inverter/capacitor chain (G1122-C1122, G1124-C1124, G1126-C1126, G1128, and G1129), power up signal PUP may transition to a logic low level.

With power up signal PUP at a logic low level, temperature sensor circuits (120 and 130) may be enabled.

In temperature sensor circuit 120 (FIG. 3), logic gate G300 may receive power up signal PUP, count limit signal MAX, and count transition signal CTD having low logic levels. With all inputs at a low logic level, NOR logic gate G300 may provide a logic high output. In this way, the n-channel IGFET N310 and p-channel IGFET P310 of passgate PG300 may respectively receive a logic high level and logic low level and passgate PG300 may be turned on and provide a low impedance between the output of amplifier circuit AMP300 and output terminal providing increment signal INC. N-channel IGFET N300 may receive a logic low level and may be turned off to provide a high impedance path from the output terminal producing increment signal INC and a ground potential.

In temperature sensor circuit 130 (FIG. 4), logic gate G400 may receive power up signal PUP, count limit signal MIN, and count transition signal CTD having low logic levels. With all inputs at a low logic level, NOR logic gate G400 may provide a logic high output. In this way, the n-channel IGFET N410 and p-channel IGFET P410 of passgate PG400 may respectively receive a logic high level and logic low level and passgate PG400 may be turned on and provide a low impedance between the output of inverter logic gate G420 and output terminal providing decrement signal DEC. N-channel IGFET N400 may receive a logic low level and may be turned off to provide a high impedance path from the output terminal producing decrement signal DEC and a ground potential.

At this time, count value CNT[5:1] has a value of "10000" to set the temperature range as temperature range W33 as an initial condition in power up. However, the temperature of semiconductor device 100 may be outside temperature range W33. In this particular power up example, the temperature of semiconductor device 100 may be within temperature range W39.

Therefore, once temperature sensor circuits (120 and 130) are enabled, temperature sensor circuit 120 may detect a temperature above the upper limit value of temperature range W32. In this way, shortly after time T2, increment signal INC may transition from a logic low level to a logic high level. Counter circuit 140 (FIG. 6) may receive the logic high increment signal INC. Counter cell CS1 may receive increment signal INC at a count up input terminal CUIN. A time delay later (determined by inverting delay stage INVD), increment signal INC may propagate to provide a high logic level at the clock input CLK of all the counter stages (CS1 to CS5). Because the least significant bit CNT[1] of count value CNT[5:1] is at a logic low level, only the least significant bit CNT[1] may toggle in response to receiving a high logic level at the clock input CLK. In this way, the count value CNT[5:1] may transition from "10000" to "10001".

Count transition detector 160 (FIG. 9) may provide a high going pulse as count transition signal CTD in response to the transition of least significant bit CNT[1] of count value CNT[5:1].

Temperature sensors circuits (120 and 130) may receive the high going pulse of count transition signal CTD.

In temperature sensor circuit 120 (FIG. 3), logic gate G300 may receive count transition signal CTD having a logic high level. Because logic gate G300 is a NOR gate, the output of logic gate G300 may be low. In this way, the n-channel IGFET 310 and p-channel IGFET P310 of passgate PG300 may respectively receive a logic low level and logic high level and passgate PG300 may be turned off and in a high impedance state. N-channel IGFET N300 may receive a logic high level and may be turned on to provide a low impedance path from the output terminal producing increment signal INC and a ground potential. In this way increment signal INC may be forcibly set to a logic low level. Therefore, increment signal INC transitions to a logic low level, in response to count transition signal CTD transitioning to a logic high level and temperature sensor circuit 120 may be disabled during the period in which count transition signal CTD is at a logic high level. In a similar manner temperature sensor circuit 130 may be disabled during the period in which count transition signal CTD is at a logic high level.

Temperature sensor circuits (120 and 130) may receive count value CNT[5:1] having a value of "10001" at the input of variable resistors (310 and 410). In this way, when count transition signal CTD transitions to a low logic level, the temperature sensor circuits (120 and 130) may be set to a temperature range W34.

Because the temperature of semiconductor device 100 is above the upper limit value of temperature range W34, temperature sensor circuit 130 may detect a temperature above the upper limit value of temperature range W34. In this way, shortly after time T3, increment signal INC may transition from a logic low level to a logic high level. In response to increment signal INC transitioning, count value CNT[5:1] may increment from "10001" to "10010" in a manner described above and the temperature range may be set to temperature range W35.

Because the temperature of semiconductor device 100 is above the upper limit value of temperature range W35, temperature sensor circuit 130 may detect a temperature above the upper limit value of temperature range W35. In this way, shortly after time T3, increment signal INC may transition from a logic low level to a logic high level. In response to increment signal INC transitioning, count value CNT[5:1] may increment from "10010" to "10011" in a manner described above and the temperature range may be set to temperature range W36.

This procedure may be repeated at times T5, T6, and T7 until the count value CNT[5:1] becomes "10110" and the temperature range is set to temperature range W39 which is the range in which the actual temperature of semiconductor device 100 may be currently operating.

At time T8, the power up circuit 190 (FIG. 11) may produce a power up pulse PUPD that transitions from a logic high to a logic low level. In response to this transition, control circuit 180 (FIG. 10) may provide a read pulse having essentially the pulse width of the propagation time of delay circuit D1012. Performance parameter table 170 (FIG. 12) may receive the read signal and may provide performance parameters (PP1 to PPm) in accordance with the word line (WL1 to WLx) activated by count value CNT[5:1] having a value of "10110".

After a delay time that is essentially the propagation delay of delay circuit D1032, control circuit 180 may provide a high going pulse for load signal LOAD having a pulse width that is essentially the propagation delay of delay circuit D1034. In this way, performance parameters PP[m:1] may be latched into register circuits 1500 to provide latched performance parameters PPL[m:1]. At this time the power up procedure may be completed and the performance parameter adjusted circuits 1420 may be optimized for operating in a temperature range W39 (i.e. the temperature in which semiconductor device 100 is currently after power up).

By initializing counter 140 to have a count value near the midpoint of the allowed temperature operating range of semiconductor device 100, the specific operating range among all operating ranges for temperature sensing circuits (120 to 130) may be set without undue toggling of count value CNT[5:1] and thereby unduly wasting current.

Figure 18:
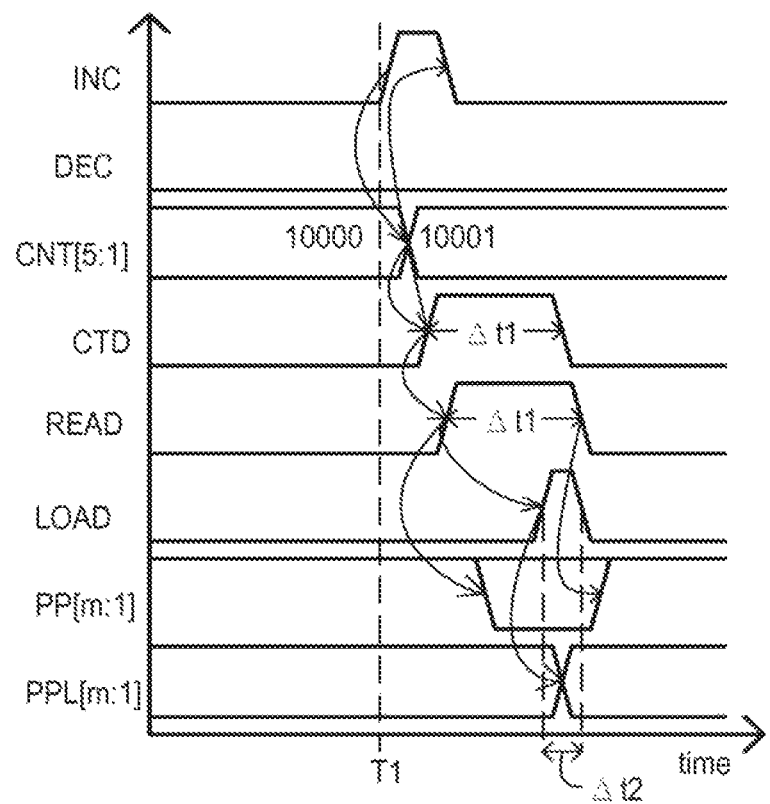
FIG. 18 is a waveform diagram illustrating a detection of an increase in temperature from a first temperature range to a second temperature range for a semiconductor device according to an embodiment.

Referring now to FIG. 18, a waveform diagram illustrating a detection of an increase in temperature from a first temperature range to a second temperature range is set forth.

The waveform diagram of FIG. 18 includes increment signal INC, decrement signal DEC, count value CNT[5:1] (a 5-bit counter), count transition signal CTD, read signal READ, load signal LOAD, performance parameters PP[m:1], and latched performance parameters PPL[m:1]).

Initially, the temperature of semiconductor device 100 may be in a first temperature range established by count value CNT[5:1]=10000. At this time, read signal READ may be at a logic low level and precharge circuit 1220 (FIG. 13) may provide a low impedance path between power supply VDD and each column line providing performance parameters PP[m:1] (each p-channel IGFET P1300 may be turned on). In this way, each column line may be precharged to a logic high level (essentially power supply VDD).

At time T1, temperature sensor circuit 120 (FIG. 3) may detect an increase in temperature of semiconductor device 100 to the upper temperature range upper limit value (the range established by count value CNT[5:1]=10000). In response to this temperature increase, increment signal INC may transition to a logic high level. Counter circuit 140 (FIG. 6) may receive the logic high increment signal INC. Counter cell CS1 may receive increment signal INC at a count up input terminal CUIN. A time delay later (determined by inverting delay stage INVD), increment signal INC may propagate to provide a high logic level at the clock input CLK (counter clock CLK) of all the counter stages (CS1 to CS5). Because the least significant bit CNT[1] of count value CNT[5:1] is at a logic low level, only the least significant bit CNT[1] may toggle in response to receiving a high logic level at the clock input CLK. In this way, the count value CNT[5:1] may transition from "10000" to "10001". It should be noted inverting delay stage INVD is provided to ensure that count up signals (CUP1 to CUP4) have propagated through the entire chain of counter stages (CS1 to CS5) before the counter stages are clocked by counter clock CCLK.

Count transition detector 160 (FIG. 9) may provide a high going pulse as count transition signal CTD in response to the transition of least significant bit CNT[1] of count value CNT[5:1]. The count transition signal may have a pulse width Δt1 that is essentially the propagation delay of delay circuit D910.

Temperature sensors circuits (120 and 130) may receive the high going pulse of count transition signal CTD and increment signal INC may be forcibly set to a logic low level in response to count transition signal CTD as previously described.

Temperature sensor circuits (120 and 130) may receive count value CNT[5:1] having a value of "10001" at the input of variable resistors (310 and 410). In this way, when count transition signal CTD transitions to a low logic level, the temperature sensor circuits (120 and 130) may be set to a temperature range as determined by count value CNT[5:1] having a value of "10001".

In response to count transition signal CTD pulse, read signal generating circuit 1010 in control circuit 1010 (FIG. 10) may provide a read signal READ having a high going pulse that essentially has the same pulse width Δt1 as count transitions signal CTD.

When read signal READ goes high, precharge circuit 1220 (FIG. 12 and FIG. 13) may be disabled (each p-channel IGFET P1300 may be turned off) and a high impedance path may be provided between power supply VDD and each column line providing performance parameters PP [m:1].

Row selection circuit 1210 (FIG. 12) may be enabled by read signal READ to activate a predetermined word line (WL1 to WLx, where x=2″) in response to the value (10001) of count value (CNT[1] to CNT[n]). In this way, each column line may be driven by a selected memory cell MC to provide performance parameters PP[m:1].

After a delay time that is essentially the propagation delay of delay circuit D1032, control circuit 180 (FIG. 10) may provide a high going pulse for load signal LOAD having a pulse width Δt2 that is essentially the propagation delay of delay circuit D1034. In this way, performance parameters PP[m:1] may be latched into register circuits 1500 to provide latched performance parameters PPL[m:1].

Figure 19:
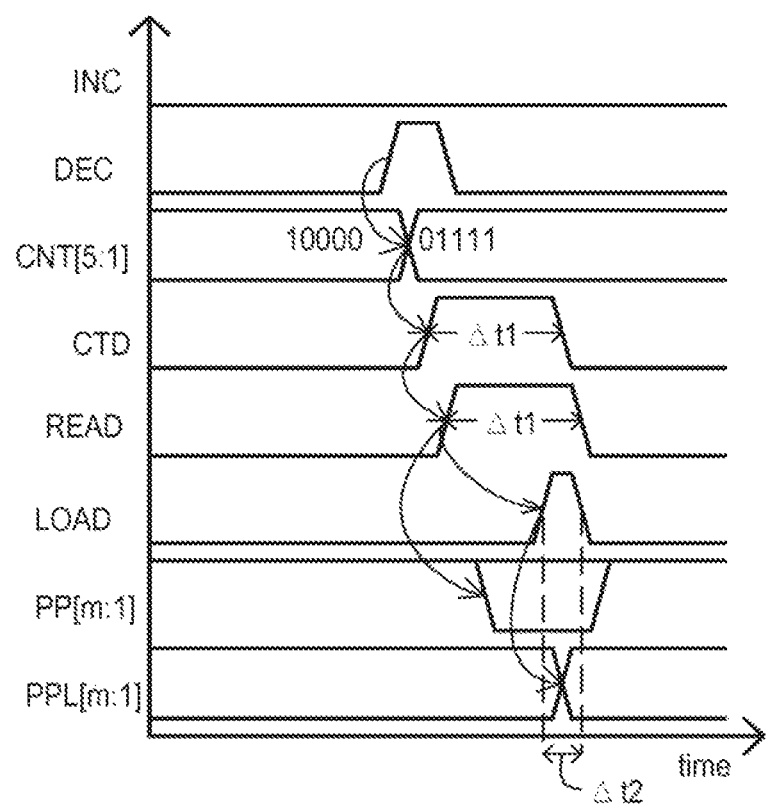
FIG. 19 is a waveform diagram illustrating a detection of a decrease in temperature from a first temperature range to a second temperature range for a semiconductor device according to an embodiment.

Referring now to FIG. 19, a waveform diagram illustrating a detection of a decrease in temperature from a first temperature range to a second temperature range is set forth.

The waveform diagram of FIG. 19 includes increment signal INC, decrement signal DEC, count value CNT[5:1] (a 5-bit counter), count transition signal CTD, read signal READ, load signal LOAD, performance parameters PP[m:1], and latched performance parameters PPL[m:1]).

The operation of decreasing from a first temperature range to a second temperature range is essentially the same as increasing from a first temperature range to a second temperature range as described with respect to FIG. 18 above except temperature sensor circuit 130 provides a decrement signal DEC to counter circuit 140 and counter may toggle all bits of count value CNT[5:1] due to the propagation of count down signals (CDN1 to CDN4) providing logic high levels indicating counter stages (CS1 to CS5) are to toggle bits of count value CNT[5:1]. In this way, the count value CNT[5:1] may transition from "10000" to "01111" and the temperature sensor circuits (120 and 130) may be set to a temperature range as determined by count value CNT[5:1] having a value of "01111".

Figure 20:
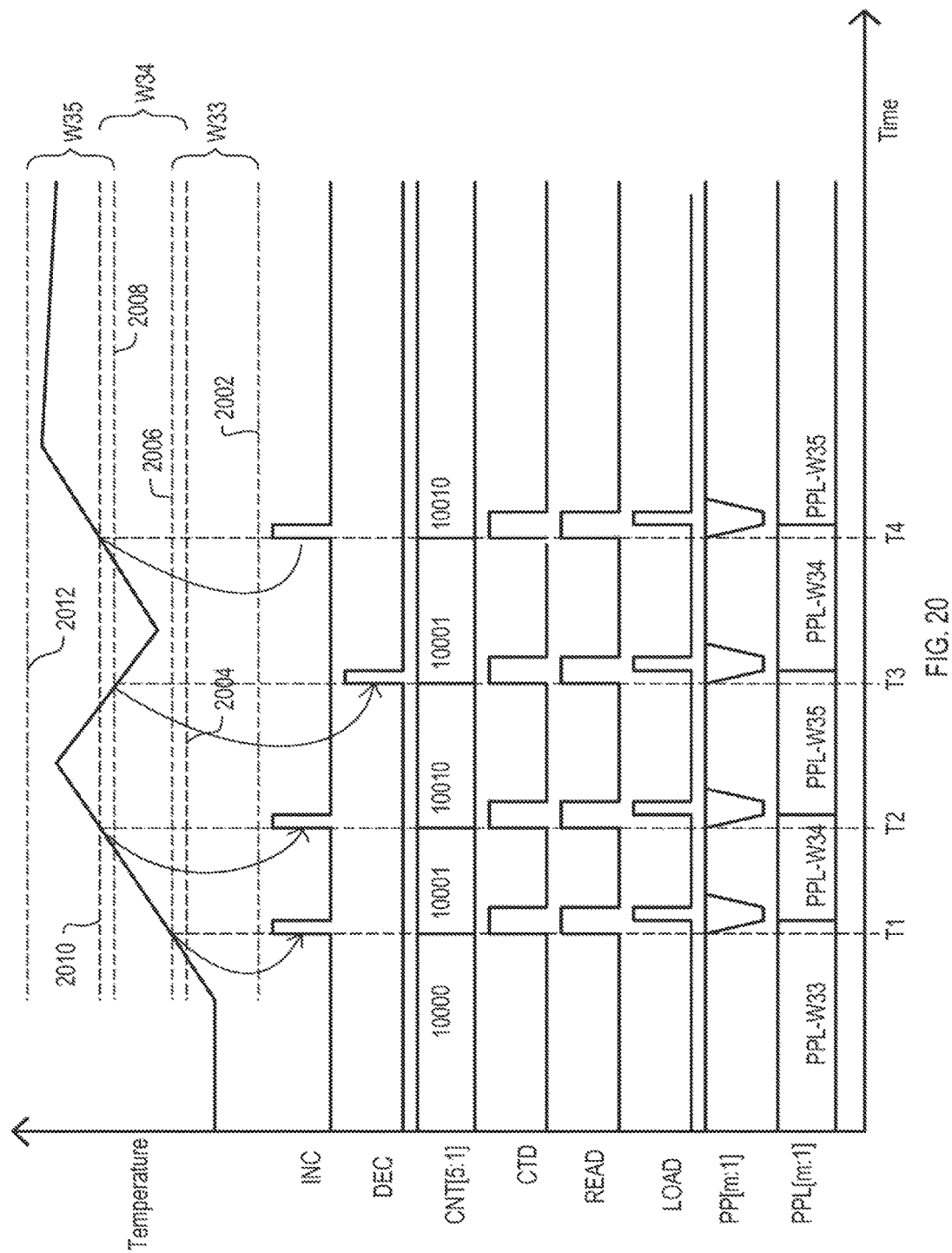
FIG. 20 is a waveform diagram the operation of a semiconductor device over various temperature ranges according to an embodiment.

Referring now to FIG. 20, a waveform diagram illustrating the operation of semiconductor device 100 over various temperature ranges.

The waveform diagram of FIG. 20 includes a temperature waveform Temperature, increment signal INC, decrement signal DEC, count value CNT[5:1] (indicating a 5-bit counter 140), count transition signal CTD, read signal READ, load signal LOAD, performance parameters PP[m:1], and latched performance parameters PPL[m:1].

The temperature Temperature illustrated in the waveform diagram of FIG. 20 includes three temperature ranges (W33, W34, and W35). Temperature range W33 includes a temperature range lower limit value 2002 and a temperature range upper limit value 2006. Temperature range W34 includes a temperature range lower limit value 2004 and a temperature range upper limit value 2010. Temperature range W35 includes a temperature range lower limit value 2008 and a temperature range upper limit value 2012. It should be noted that temperature range W34 overlaps a portion of both adjacent temperature ranges (W33 and W35).

Initially, semiconductor device 100 may be operating in a temperature range W33 as set by count value CNT[5:1] having a value of "10000". Temperature range W33 may have a temperature range lower limit value 2002 and a temperature range upper limit value 2006. At this time latched performance parameters PPL[m:1] may have a value (shown as PPL-W33) for operating within temperature range W33.

At time T1, the temperature of semiconductor device 100 can reach the temperature range upper limit value 2006 and temperature sensor circuit 120 (FIG. 3) may provide an increment signal INC that transitions from a low logic level to a high logic level. Count value CNT[5:1] may be incremented in response to increment signal INC to provide a count value CNT[5:1] having a value of "10001". Count transition signal CTD may detect a transition in the least significant bit CNT[1] of count value CNT[5:1] to provide a high going pulse. Read signal READ may be generated in response to count transition signal. In this way, performance parameters PP[m:1] may be provided. Load signal LOAD may be generated in response to read signal READ and performance parameter PP[m:1] may be latched to provide latched performance parameters PPL[5:1].

At this time latched performance parameters PPL[m:1] may have a value (shown as PPL-W34) for operating within temperature range W34. Temperature range W34 may have a temperature range lower limit value 2004 and a temperature range upper limit value 2010. The temperature range lower limit value 2004 of temperature range W34 may be at a lower temperature than the temperature range upper limit value 2006 of temperature range W33. In this way, temperature ranges (W33 and W34) may overlap. The temperature range lower limit value 2008 of temperature range W35 may be at a lower temperature than the temperature range upper limit value 2010 of temperature range W34. In this way, temperature ranges (W34 and W35) may overlap.

At time T2, the temperature of semiconductor device 100 can reach the temperature range upper limit value 2010 and temperature sensor circuit 120 (FIG. 3) may provide a increment signal INC that transitions from a low logic level to a high logic level. Count value CNT[5:1] may be incremented in response to increment signal INC to provide a count value CNT[5:1] having a value of "10010". Count transition signal CTD may detect a transition in the least significant bit CNT[1] of count value CNT[5:1] to provide a high going pulse. Read signal READ may be generated in response to count transition signal. In this way, performance parameters PP[m:1] may be provided. Load signal LOAD may be generated in response to read signal READ and performance parameter PP[m:1] may be latched to provide latched performance parameters PPL[5:1].

At this time, latched performance parameters PPL[m:1] may have a value (shown as PPL-W35) for operating within temperature range W35. Temperature range W35 may have a temperature range lower limit value 2008 and a temperature range upper limit value 2012. The temperature range lower limit value 2008 of temperature range W35 may be at a lower temperature than the temperature range upper limit value 2010 of temperature range W34. In this way, temperature ranges (W34 and W35) may overlap.

At time T3, the temperature of semiconductor device 100 can reach the temperature range lower limit value 2008 and temperature sensor circuit 130 (FIG. 4) may provide a decrement signal DEC that transitions from a low logic level to a high logic level. Count value CNT[5:1] may be decremented in response to decrement signal DEC to provide a count value CNT[5:1] having a value of "10001". Count transition signal CTD may detect a transition in the least significant bit CNT[1] of count value CNT[5:1] to provide a high going pulse. Read signal READ may be generated in response to count transition signal. In this way, performance parameters PP[m:1] may be provided. Load signal LOAD may be generated in response to read signal READ and performance parameter PP[m:1] may be latched to provide latched performance parameters PPL[5:1].

At this time, latched performance parameters PPL[m:1] may have a value (shown as PPL-W34) for operating within temperature range W34.

At time T4, the temperature of semiconductor device 100 can once again reach the temperature range upper limit value 2010 and temperature sensor circuit 120 (FIG. 3) may provide a increment signal INC that transitions from a low logic level to a high logic level. Count value CNT[5:1] may be incremented in response to increment signal INC to provide a count value CNT[5:1] having a value of "10010". Count transition signal CTD may detect a transition in the least significant bit CNT[1] of count value CNT[5:1] to provide a high going pulse. Read signal READ may be generated in response to count transition signal. In this way, performance parameters PP[m:1] may be provided. Load signal LOAD may be generated in response to read signal READ and performance parameter PP[m:1] may be latched to provide latched performance parameters PPL[5:1].

At this time, latched performance parameters PPL[m:1] may have a value (shown as PPL-W35) for operating within temperature range W35.

Figure 21:
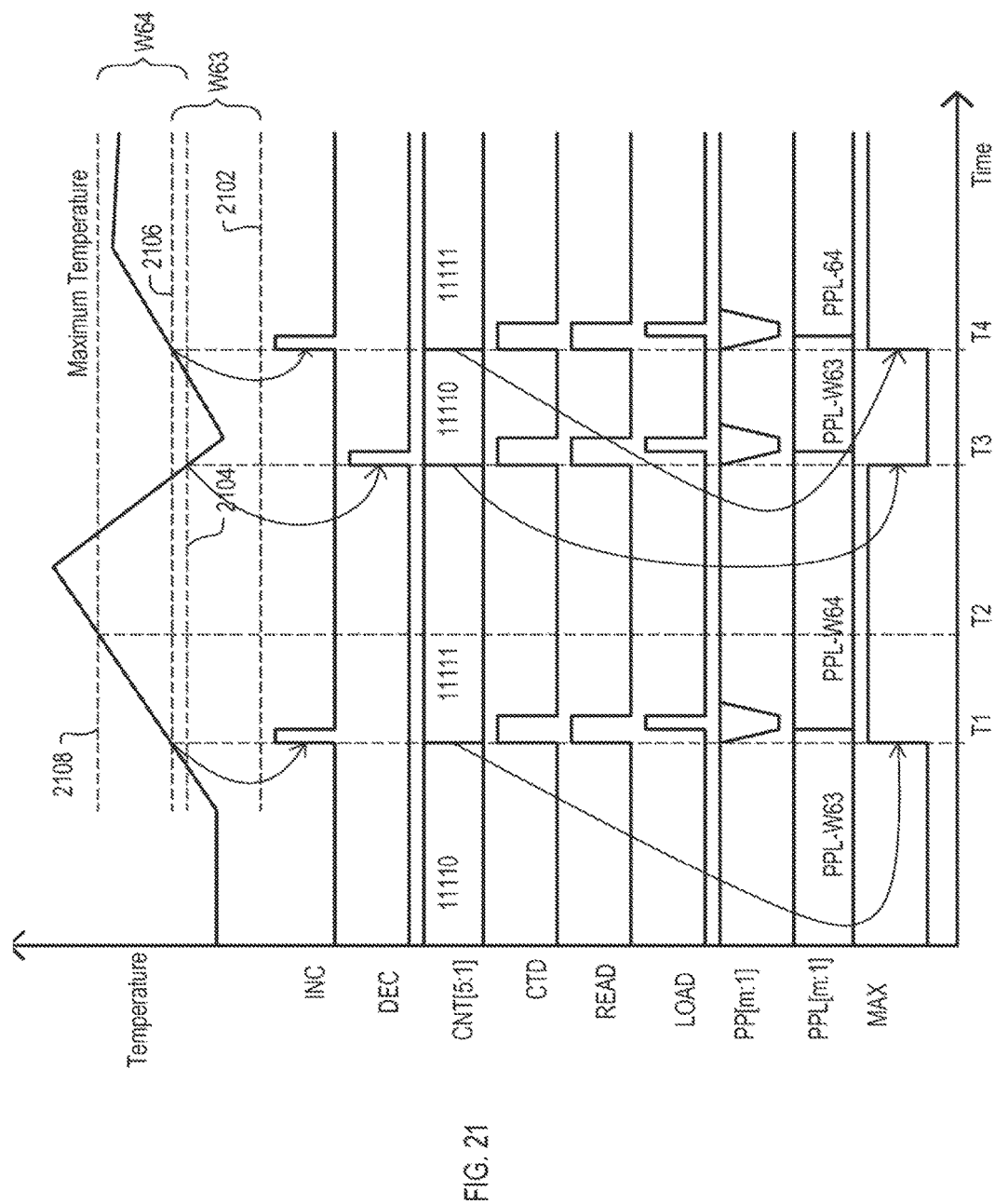
FIG. 21 is a waveform diagram the operation of a semiconductor device over various temperature ranges near a maximum temperature range according to an embodiment.

Referring now to FIG. 21, a waveform diagram illustrating the operation of semiconductor device 100 over various temperature ranges near a maximum temperature range.

The waveform diagram of FIG. 21 includes a temperature waveform Temperature, increment signal INC, decrement signal DEC, count value CNT[5:1] (indicating a 5-bit counter 140), count transition signal CTD, read signal READ, load signal LOAD, performance parameters PP[m:1], latched performance parameters PPL[m:1], and count limit signal MAX.

The temperature Temperature illustrated in the waveform diagram of FIG. 21 includes two temperature ranges (W63 and W64). Temperature range W63 includes a temperature range lower limit value 2102 and a temperature range upper limit value 2106. Temperature range W64 includes a temperature range lower limit value 2104 and a temperature range upper limit value 2108.

Initially, semiconductor device 100 may be operating in a temperature range W63 as set by count value CNT[5:1] having a value of "11110". At this time, latched performance parameters PPL[m:1] may have a value (shown as PPL-W63) for operating within temperature range W63.

At time T1, the temperature of semiconductor device 100 can reach the temperature range upper limit value 2106 and temperature sensor circuit 120 (FIG. 3) may provide a increment signal INC that transitions from a low logic level to a high logic level. Count value CNT[5:1] may be incremented in response to increment signal INC to provide a count value CNT[5:1] having a value of "11111". Count transition signal CTD may detect a transition in the least significant bit CNT[1] of count value CNT[5:1] to provide a high going pulse. Read signal READ may be generated in response to count transition signal. In this way, performance parameters PP[m:1] may be provided. Load signal LOAD may be generated in response to read signal READ and performance parameter PP[m:1] may be latched to provide latched performance parameters PPL[5:1].

At this time latched performance parameters PPL[m:1] may have a value (shown as PPL-W64) for operating within temperature range W64. Temperature range W64 may have a temperature range lower limit value 2104 and a temperature range upper limit value 2108.

Also, at this time maximum count limit circuit 800a (FIG. 8) of count limit detector 150 may provide a count limit signal MAX that transitions to a high logic level in response to count value[5:1] having a value of "11111".

In temperature sensor circuit 120 (FIG. 3), logic gate G300 may receive count limit signal MAX having a logic high level. Because logic gate G300 is a NOR gate, the output of logic gate G300 may be low. In this way, the n-channel IGFET 310 and p-channel IGFET P310 of passgate PG300 may respectively receive a logic low level and logic high level and passgate PG300 may be turned off and in a high impedance state. N-channel IGFET N300 may receive a logic high level and may be turned on to provide a low impedance path from the output terminal producing increment signal INC and a ground potential. In this way, increment signal INC may be forcibly set to a logic low level. Therefore, temperature sensor circuit 120 may be disabled in response to count limit signal MAX being at a logic high level.

At time T2, the temperature of semiconductor device 100 can reach the temperature range upper lower value 2108. However, because count limit signal MAX is at a logic high level, increment signal INC remains at a logic low level. Therefore, count value CNT[5:1] can retain a value of "11111" and latched performance parameters PPL[m:1] may retain a value (shown as PPL-W64) for operating within temperature range W64. Count limit signal MAX operates to prevent counter 140 from rolling over to a count of "00000" from "11111". The performance parameters PPL-W64 corresponding to a count value of "11111" may be set to provide a reasonable margin to allow semiconductor device 100 to continue to operate at high temperatures beyond temperature range W64.

At time T3, the temperature of semiconductor device 100 can reach the temperature range lower limit value 2104 and temperature sensor circuit 130 (FIG. 4) may provide a decrement signal DEC that transitions from a low logic level to a high logic level. Count value CNT[5:1] may be decremented in response to decrement signal DEC to provide a count value CNT[5:1] having a value of "11110". Count transition signal CTD may detect a transition in the least significant bit CNT[1] of count value CNT[5:1] to provide a high going pulse. Read signal READ may be generated in response to count transition signal. In this way, performance parameters PP[m:1] may be provided. Load signal LOAD may be generated in response to read signal READ and performance parameter PP[m:1] may be latched to provide latched performance parameters PPL[5:1].

At this time, latched performance parameters PPL[m:1] may have a value (shown as PPL-W63) for operating within temperature range W63.

At time T4, the temperature of semiconductor device 100 can once again reach the temperature range upper limit value 2106 and temperature sensor circuit 120 (FIG. 3) may provide a increment signal INC that transitions from a low logic level to a high logic level. Count value CNT[5:1] may be incremented in response to increment signal INC to provide a count value CNT[5:1] having a value of "11111". Count transition signal CTD may detect a transition in the least significant bit CNT[1] of count value CNT[5:1] to provide a high going pulse. Read signal READ may be generated in response to count transition signal. In this way, performance parameters PP[m:1] may be provided. Load signal LOAD may be generated in response to read signal READ and performance parameter PP[m:1] may be latched to provide latched performance parameters PPL[5:1].

At this time latched performance parameters PPL[m:1] may have a value (shown as PPL-W64) for operating within temperature range W64. Temperature range W64 may have a temperature range lower limit value 2104 and a temperature range upper limit value 2108.

Also, at this time maximum count limit circuit 800a (FIG. 8) of count limit detector 150 may once again provide a count limit signal MAX that transitions to a high logic level in response to count value[5:1] having a value of "11111". At this time temperature sensor circuit 120 may once again be disabled in response to count limit signal MAX having a high logic level so that counter 140 may not roll over from a count value CNT[5:1] of "11111" to "00000" in response to an undesired increment signal INC.

Figure 22:
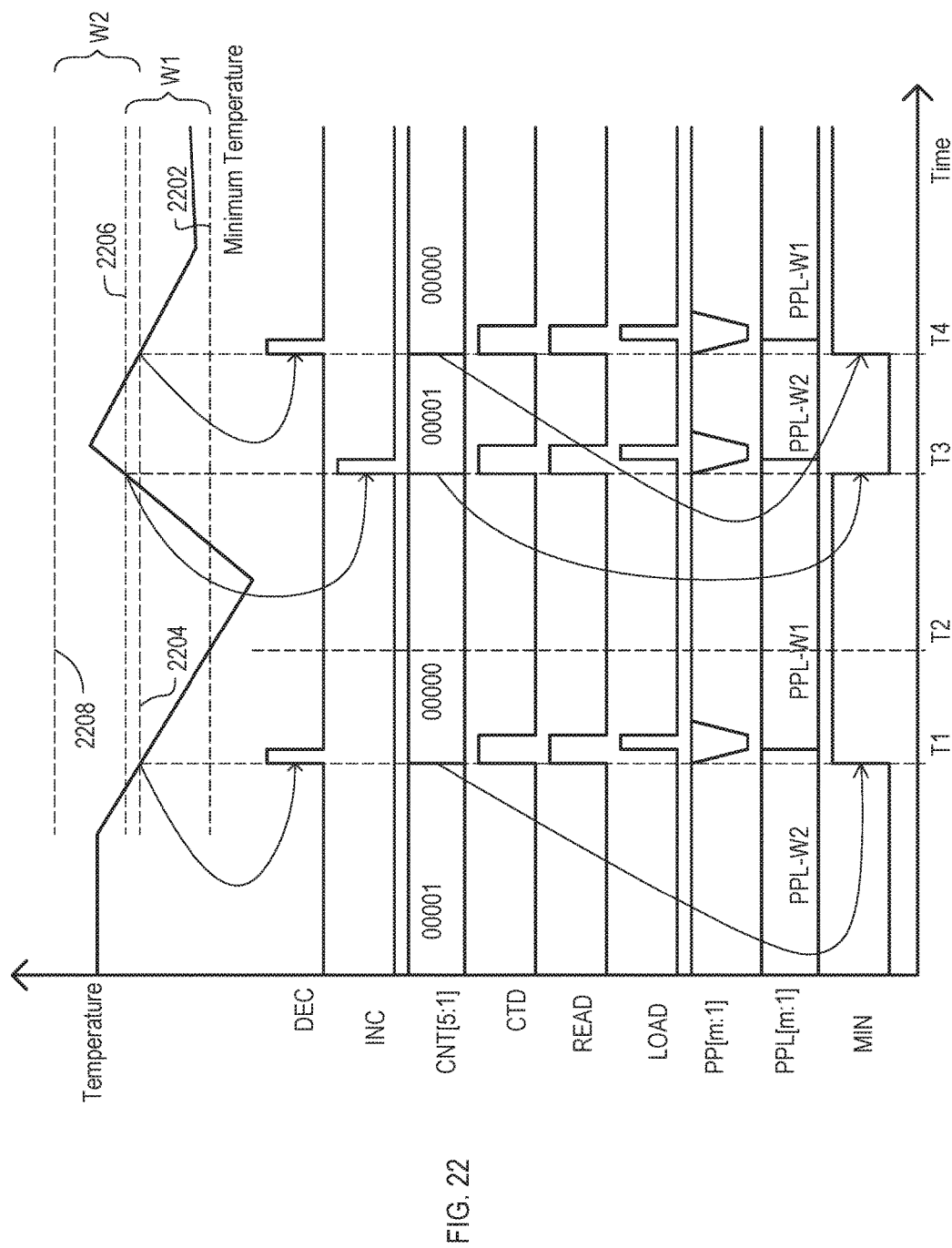
FIG. 22 is a waveform diagram the operation of a semiconductor device over various temperature ranges near a minimum temperature range according to an embodiment.

Referring now to FIG. 22, a waveform diagram illustrating the operation of semiconductor device 100 over various temperature ranges near a minimum temperature range.

The waveform diagram of FIG. 22 includes a temperature waveform Temperature, increment signal INC, decrement signal DEC, count value CNT[5:1] (indicating a 5-bit counter 140), count transition signal CTD, read signal READ, load signal LOAD, performance parameters PP[m:1], latched performance parameters PPL[m:1], and count limit signal MIN.

The temperature Temperature illustrated in the waveform diagram of FIG. 22 includes two temperature ranges (W1 and W2). Temperature range W1 includes a temperature range lower limit value 2202 and a temperature range upper limit value 2206. Temperature range W2 includes a temperature range lower limit value 2204 and a temperature range upper limit value 2208.

Initially, semiconductor device 100 may be operating in a temperature range W2 as set by count value CNT[5:1] having a value of "00001". At this time, latched performance parameters PPL[m:1] may have a value (shown as PPL-W2) for operating within temperature range W2.

At time T1, the temperature of semiconductor device 100 can reach the temperature range lower limit value 2204 and temperature sensor circuit 130 (FIG. 4) may provide a decrement signal DEC that transitions from a low logic level to a high logic level. Count value CNT[5:1] may be decremented in response to increment signal DEC to provide a count value CNT[5:1] having a value of "00000". Count transition signal CTD may detect a transition in the least significant bit CNT[1] of count value CNT[5:1] to provide a high going pulse. Read signal READ may be generated in response to count transition signal. In this way, performance parameters PP[m:1] may be provided. Load signal LOAD may be generated in response to read signal READ and performance parameter PP[m:1] may be latched to provide latched performance parameters PPL[5:1].

At this time latched performance parameters PPL[m:1] may have a value (shown as PPL-W1) for operating within temperature range W1. Temperature range W1 may have a temperature range lower limit value 2202 and a temperature range upper limit value 2206.

Also, at this time minimum count limit circuit 800b (FIG. 8) of count limit detector 150 may provide a count limit signal MIN that transitions to a high logic level in response to count value[5:1] having a value of "00000".

In temperature sensor circuit 130 (FIG. 4), logic gate G400 may receive count limit signal MIN having a logic high level. Because logic gate G400 is a NOR gate, the output of logic gate G400 may be low. In this way, the n-channel IGFET 410 and p-channel IGFET P410 of passgate PG400 may respectively receive a logic low level and logic high level and passgate PG400 may be turned off and in a high impedance state. N-channel IGFET N400 may receive a logic high level and may be turned on to provide a low impedance path from the output terminal producing decrement signal DEC and a ground potential. In this way, decrement signal DEC may be forcibly set to a logic low level. Therefore, temperature sensor circuit 130 may be disabled in response to count limit signal MIN being at a logic high level.

At time T2, the temperature of semiconductor device 100 can reach the temperature range lower limit value 2202. However, because count limit signal MIN is at a logic high level, decrement signal DEC remains at a logic low level. Therefore, count value CNT[5:1] can retain a value of "00000" and latched performance parameters PPL[m:1] may retain a value (shown as PPL-W1) for operating within temperature range W1. Count limit signal MIN operates to prevent counter 140 from rolling over to a count of "11111" from "00000". The performance parameters PPL-W1 corresponding to a count value of "00000" may be set to provide a reasonable margin to allow semiconductor device 100 to continue to operate at high temperatures below temperature range W1.

At time T3, the temperature of semiconductor device 100 can reach the temperature range upper limit value 2206 and temperature sensor circuit 120 (FIG. 3) may provide a increment signal INC that transitions from a low logic level to a high logic level. Count value CNT[5:1] may be incremented in response to decrement signal INC to provide a count value CNT[5:1] having a value of "00001". Count transition signal CTD may detect a transition in the least significant bit CNT[1] of count value CNT[5:1] to provide a high going pulse. Read signal READ may be generated in response to count transition signal. In this way, performance parameters PP[m:1] may be provided. Load signal LOAD may be generated in response to read signal READ and performance parameter PP[m:1] may be latched to provide latched performance parameters PPL[5:1].

At this time, latched performance parameters PPL[m:1] may have a value (shown as PPL-W2) for operating within temperature range W2.

At time T4, the temperature of semiconductor device 100 can once again reach the temperature range lower limit value 2204 and temperature sensor circuit 130 (FIG. 4) may provide a decrement signal DEC that transitions from a low logic level to a high logic level. Count value CNT[5:1] may be decremented in response to increment signal DEC to provide a count value CNT[5:1] having a value of "00000". Count transition signal CTD may detect a transition in the least significant bit CNT[1] of count value CNT[5:1] to provide a high going pulse. Read signal READ may be generated in response to count transition signal. In this way, performance parameters PP[m:1] may be provided. Load signal LOAD may be generated in response to read signal READ and performance parameter PP[m:1] may be latched to provide latched performance parameters PPL[5:1].

At this time latched performance parameters PPL[m:1] may have a value (shown as PPL-W1) for operating within temperature range W1. Temperature range W1 may have a temperature range lower limit value 2202 and a temperature range upper limit value 2206.

Also, at this time minimum count limit circuit 800b (FIG. 8) of count limit detector 150 may once again provide a count limit signal MIN that transitions to a high logic level in response to count value CNT[5:1] having a value of "00000". At this time temperature sensor circuit 130 may once again be disabled in response to count limit signal MIN having a high logic level so that counter 140 may not roll over from a count value CNT[5:1] of "00000" to "11111" in response to an undesired decrement signal DEC.

Figure 23:
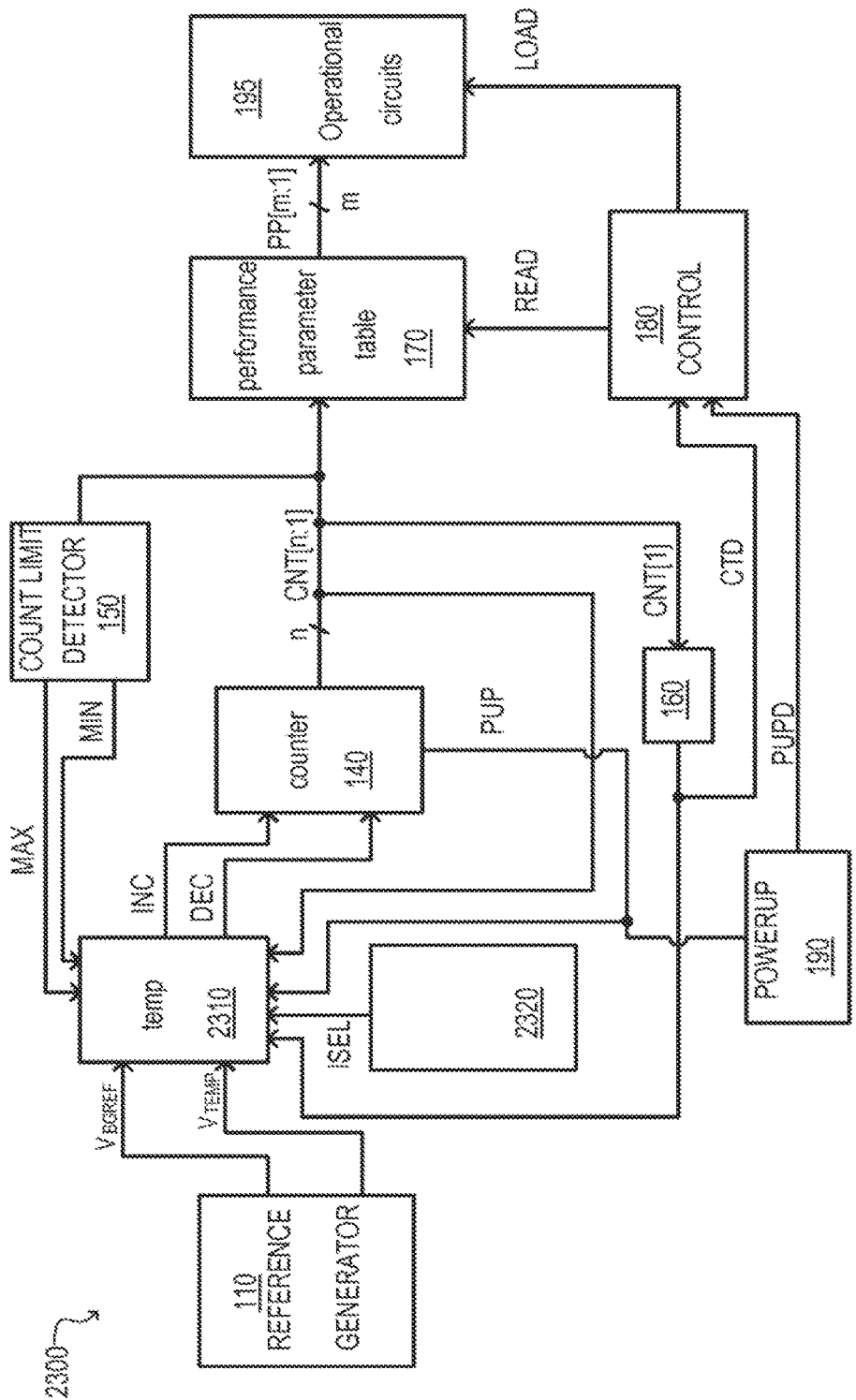
FIG. 23 is a block schematic diagram of a semiconductor device according to an embodiment.

Referring now to FIG. 23, a semiconductor device according to an embodiment is set forth in a block schematic diagram and given the general reference character 2300.

Semiconductor device 2300 may include similar constituents and semiconductor device 100. Such constituents may be given the same reference character and a description of such may be omitted. Semiconductor device 2300 may differ from semiconductor device 100 in that temperature sensor circuit 2310 may be included instead of temperature sensor circuits (120 and 130). Semiconductor device 2300 may further include a selection circuit 2320.

Temperature sensor circuit 2310 may receive reference voltages ($V_{BGREF}$ and $V_{TEMP}$), count limit signals (MIN and MAX), count transition signal CTD, power up signal PUP, count value CNT[n:1], and a selection signal ISEL as inputs and may provide an increment signal INC and a decrement signal DEC as outputs.

Selection circuit 2320 may be an oscillator circuit that provides selection signal ISEL as a signal that oscillates between a first logic level and a second logic level. Selection signal may have an oscillation time period.

Semiconductor device 2300 may operate essentially the same as semiconductor device 100 except that temperature sensor circuit 2310 may alternate between being enabled to detect the temperature range upper limit value and the temperature range lower limit value in response to the logic state of selection signal ISEL. In particular, when selection signal ISEL has a high logic level, temperature sensor circuit 2310 may be enabled to detect the temperature range upper limit value and when selection signal ISEL has a low logic level, temperature sensor circuit 2310 may be enabled to detect the temperature range lower limit value.

Figure 24:
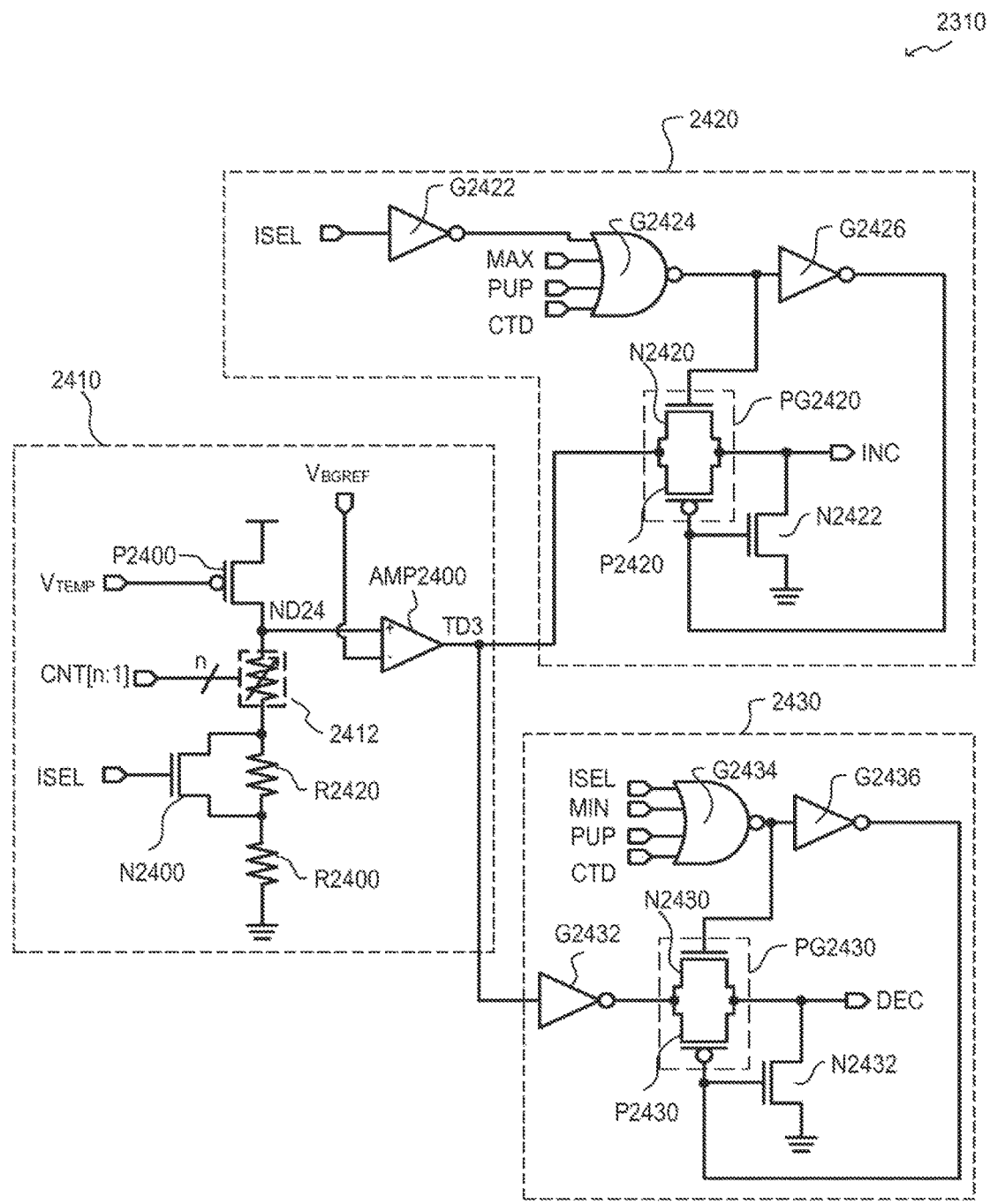
FIG. 24 is a circuit schematic diagram of a temperature sensor circuit according to an embodiment.

Referring now to FIG. 24, a circuit schematic diagram of temperature sensor circuit 2310 according to an embodiment is set forth.

Temperature sensor circuit 2310 may receive reference voltages ($V_{BGREF}$ and $V_{TEMP}$), count limit signals (MIN and MAX), count transition signal CTD, power up signal PUP, count value CNT[n:1], and a selection signal ISEL as inputs and may provide an increment signal INC and a decrement signal DEC as outputs.

Temperature sensor circuit 2310 can include a temperature sensing portion 2410, an increment signal output portion 2420, and a decrement signal output portion 2430. Temperature sensing portion 2410 can receive reference voltages ($V_{BGREF}$ and $V_{TEMP}$), count value CNT[n:1], and a selection signal ISEL as inputs and may provide a temperature detect signal TD3 as an output. Increment signal output portion 2420 may receive temperature detect signal TD3, count limit signal MAX, count transition signal CTD, power up signal PUP, and selection signal ISEL as inputs and may provide an increment signal INC as an output. Decrement signal output portion 2430 may receive temperature detect signal TD3, count limit signal MIN, count transition signal CTD, power up signal PUP, and selection signal ISEL as inputs and may provide a decrement signal DEC as an output.

Temperature sensing portion 2410 can include a p-channel insulated gate field effect transistor (IGFET) P2400, a variable resistor 2412, resistors (R2400 and R2420), n-channel IGFET N2400, and an amplifier AMP2400.

P-channel IGFET P2400 may have a source terminal connected to a power supply potential VDD, a drain commonly connected to a first terminal of variable resistor 2412 and a positive input terminal of amplifier AMP2400 at node ND24, and a gate terminal connected to receive voltage $V_{TEMP}$. The potential of voltage $V_{TEMP}$ may change inversely to the change in the temperature of the semiconductor device 100. Variable resistor 2412 may receive count value CNT[n:1] as inputs and may have a second terminal connected to a first terminal of resistor R2420 and a drain of n-channel IGFET N2400. Resistor R2420 may have a second terminal connected to a first terminal of resistor R2400 and a source terminal of n-channel IGFET N2400. N-channel IGFET N2400 may have a gate terminal connected to receive selection signal ISEL. N-channel IGFET N2400 may provide a shunt for resistor R240 in response to selection signal ISEL. Resistor R2400 may have a second terminal connected to ground a potential. Amplifier AMP2400 may have a negative input terminal connected to receive voltage $V_{BGREF}$ and an output terminal connected to provide temperature detect signal TD3. Voltage $V_{BGREF}$ may not vary with temperature and may have an essentially constant potential.

Increment signal output portion 2420 may include inverter logic gates (G2422 and G2426), NOR logic gate G2424, pass gate PG2420, and n-channel IGFET N2422.

Inverter logic gate G2422 may receive selection signal ISEL at an input terminal and may provide an output. NOR logic gate G2424 may receive the output of inverter logic gate G2422, count limit signal MAX, power up signal PUP, and count transition signal CTD as inputs and may provide an output. Inverter logic gate G2426 may receive the output of NOR logic gate G2424 at an input terminal and may provide an output. Pass gate PG2420 may receive the output of NOR logic gate G2424 and inverter logic gate G2426 as inputs and may provide a controllable impedance path between temperature detect signal TD3 and the increment signal INC. N-channel IGFET N2422 may have a drain terminal connected to increment signal INC, a source connected to a ground potential and a gate terminal connected to receive the output of inverter logic gate G2426.

Pass gate PG2420 may include an n-channel IGFET N2420 and a p-channel IGFET P2420 having source/drain terminals connected in parallel between temperature detect signal TD3 and an output terminal to provide increment signal INC. N-channel IGFET N2420 may receive the output of NOR logic gate G2424 at a gate terminal. P-channel IGFET P2420 may receive the output of inverter logic gate G2426 at a gate terminal. In this way, pass gate PG2420 may provide a controllable impedance path between the temperature detect signal TD3 and increment signal INC in response to the output of NOR logic gate G2424.

Decrement signal output portion 2430 may include inverter logic gates (G2432 and G2436), NOR logic gate G2434, pass gate PG2430, and n-channel IGFET N2432.

Inverter logic gate G2432 may receive temperature detect signal TD3 at an input terminal and may provide an output. NOR logic gate G2434 may receive the selection signal ISEL, count limit signal MAX, power up signal PUP, and count transition signal CTD as inputs and may provide an output. Inverter logic gate G2436 may receive the output of NOR logic gate G2434 at an input terminal and may provide an output. Pass gate PG2430 may receive the output of NOR logic gate G2434 and inverter logic gate G2436 as inputs and may provide a controllable impedance path between the output of inverter logic gate 2432 and the decrement signal DEC. N-channel IGFET N2432 may have a drain terminal connected to decrement signal DEC, a source connected to a ground potential and a gate terminal connected to receive the output of inverter logic gate G2436.

Pass gate PG2430 may include an n-channel IGFET N2430 and a p-channel IGFET P2430 having source/drain terminals connected in parallel between the output of inverter logic gate G2432 and the decrement signal DEC. N-channel IGFET N2430 may receive the output of NOR logic gate G2434 at a gate terminal. P-channel IGFET P2430 may receive the output of inverter logic gate G2436 at a gate terminal. In this way, pass gate PG2430 may provide a controllable impedance path between the output of inverter logic gate G2432 and the decrement signal DEC. in response to the output of NOR logic gate G2434.

Variable resistor 500 of FIG. 5 may be used as variable resistor 2412. Resistor R2420 may be selected to have a value that is between the resistance value of R510-1 and 1.5 times the resistance value of R510-1. In order to provide a more narrow overlap of temperature ranges, resistor R2420 may be selected to have a value that is between the resistance value of R510-1 and 1.1 times the resistance value of R510-1.

Figure 25:
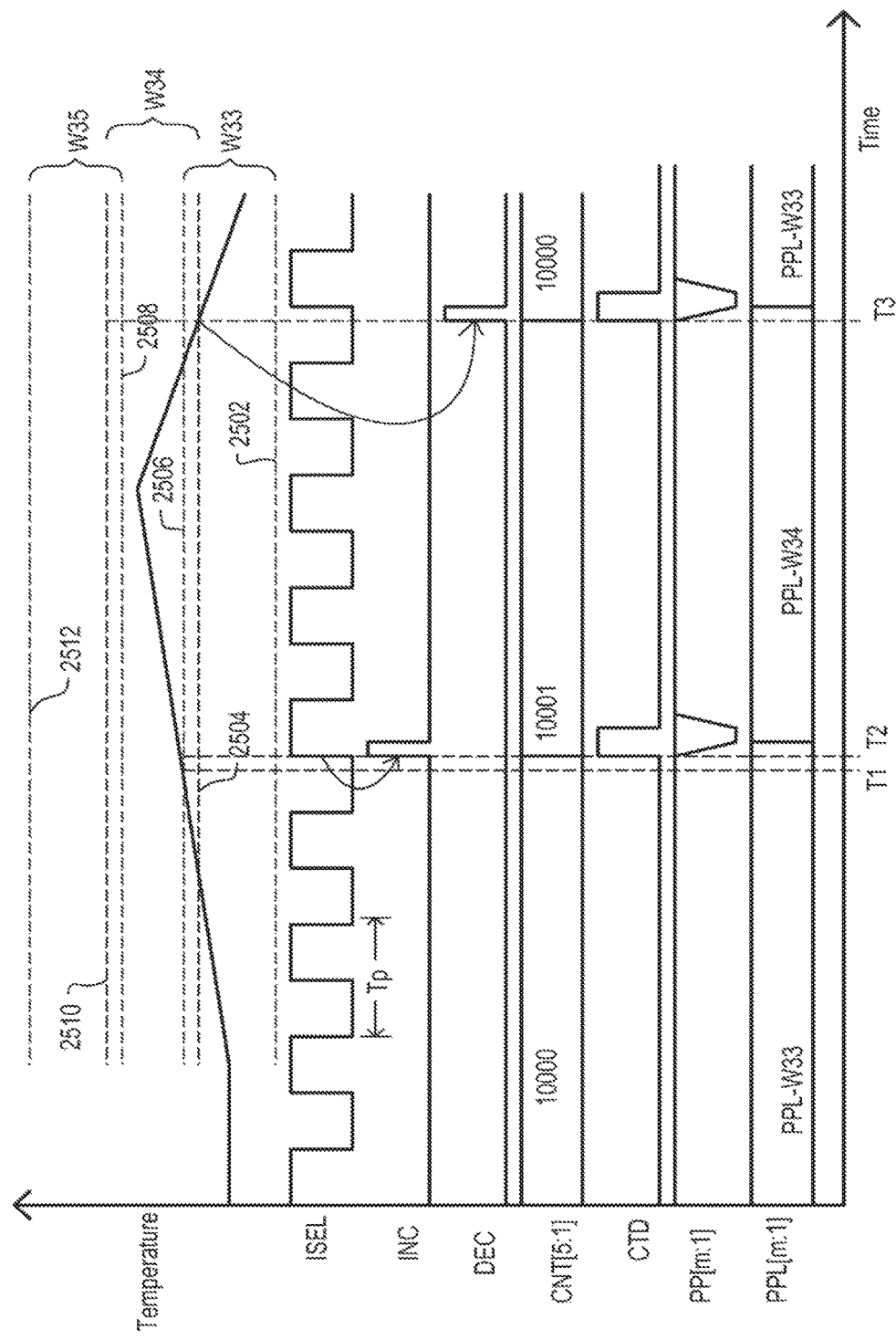
FIG. 25 is a waveform diagram illustrating the operation of a semiconductor device over various temperature ranges according to an embodiment.

Referring now to FIG. 25, a waveform diagram illustrating the operation of semiconductor device 2300 over various temperature ranges.

The waveform diagram of FIG. 25 includes a temperature waveform Temperature, selection signal ISEL, increment signal INC, decrement signal DEC, count value CNT[5:1] (indicating a 5-bit counter 140), count transition signal CTD, performance parameters PP[m:1], and latched performance parameters PPL[m:1].

The temperature Temperature illustrated in the waveform diagram of FIG. 25 includes three temperature ranges (W33, W34, and W35). Temperature range W33 includes a temperature range lower limit value 2502 and a temperature range upper limit value 2506. Temperature range W34 includes a temperature range lower limit value 2504 and a temperature range upper limit value 2510. Temperature range W35 includes a temperature range lower limit value 2508 and a temperature range upper limit value 2512. It should be noted that temperature range W34 overlaps a portion of both adjacent temperature ranges (W33 and W35).

Initially, semiconductor device 2300 may be operating in a temperature range W33 as set by count value CNT[5:1] having a value of "10000". Temperature range W33 may have a temperature range lower limit value 2502 and a temperature range upper limit value 2506. At this time latched performance parameters PPL[m:1] may have a value (shown as PPL-W33) for operating within temperature range W33.

Selection signal ISEL may be an oscillating signal generated by selection circuit 2320. Temperature sensor circuit 2310 may alternate between being enabled to detect the temperature range upper limit value and the temperature range lower limit value in response to the logic state of selection signal ISEL. In particular, when selection signal ISEL has a high logic level, temperature sensor circuit 2310 may be enabled to detect the temperature range upper limit value and when selection signal ISEL has a low logic level, temperature sensor circuit 2310 may be enabled to detect the temperature range lower limit value. Selection signal ISEL may have an oscillation time period Td. Oscillation time period Td may be selected to be long enough to allow temperature sensor circuit 2310 to detect the temperature range upper limit value and/or temperature range lower limit value for each temperature range.

At time T1, the temperature of semiconductor device 2300 can reach the temperature range upper limit value 2506. However, at this time, selection signal ISEL may be at a logic low level and temperature sensor circuit 2310 (FIG. 24) may be enabled to detect the temperature range lower limit value. In particular, with selection signal ISEL at a logic low level, n-channel IGFET N2400 in temperature sensing portion 2410 may be turned off. In this way, resistor 82420 may be included in the series resistance path between node N24 and ground so that temperature sensing portion may be enabled to detect temperature range lower limit value 2502. Also, with selection signal ISEL at a logic low level, decrement signal output portion 2430 may be enabled and increment signal output portion 2420 may be disabled.

In this way, at time T1, temperature sensor circuit 2310 may not detect the temperature of semiconductor device 2300 reaching the temperature range upper limit value 2506.

At time T2, selection signal ISEL may transition to a logic high level. With selection signal ISEL at a logic high level, n-channel IGFET N2400 in temperature sensing portion 2410 may be turned on to provide a shunt for resistor 82420. In this way, resistor 82420 may not be included in the series resistance path between node N24 and ground so that temperature sensing portion may be enabled to detect temperature range upper limit value 2506. Also, with selection signal ISEL at a logic high level, decrement signal output portion 2430 may be disabled and increment signal output portion 2420 may be enabled. Thus, at time T2, temperature sensor circuit 2310 may provide an increment signal INC that transitions from a low logic level to a high logic level. Count value CNT[5:1] may be incremented in response to increment signal INC to provide a count value CNT[5:1] having a value of "10001". Count transition signal CTD may detect a transition in the least significant bit CNT[1] of count value CNT[5:1] to provide a high going pulse. Read signal READ (not shown) may be generated in response to count transition signal. In this way, performance parameters PP[m:1] may be provided. Load signal LOAD (not shown) may be generated in response to read signal READ and performance parameter PP[m:1] may be latched to provide latched performance parameters PPL[5:1].

At this time latched performance parameters PPL[m:1] may have a value (shown as PPL-W34) for operating within temperature range W34. Temperature range W34 may have a temperature range lower limit value 2504 and a temperature range upper limit value 2510. The temperature range lower limit value 2504 of temperature range W34 may be at a lower temperature than the temperature range upper limit value 2506 of temperature range W33. In this way, temperature ranges (W33 and W34) may overlap. The temperature range lower limit value 2508 of temperature range W35 may be at a lower temperature than the temperature range upper limit value 2510 of temperature range W34. In this way, temperature ranges (W34 and W35) may overlap.

At time T3, the temperature of semiconductor device 2300 can reach the temperature range lower limit value 2504. Because at this time, selection signal ISEL has a logic low level, temperature sensor circuit 2310 (FIG. 24) may be enabled to detect the temperature range lower limit value as described above. Thus, temperature sensor circuit 2310 may provide a decrement signal DEC that transitions from a low logic level to a high logic level. Count value CNT[5:1] may be decremented in response to decrement signal DEC to provide a count value CNT[5:1] having a value of "10000". Count transition signal CTD may detect a transition in the least significant bit CNT[1] of count value CNT[5:1] to provide a high going pulse. Read signal READ (not shown) may be generated in response to count transition signal. In this way, performance parameters PP[m:1] may be provided. Load signal LOAD (not shown) may be generated in response to read signal READ and performance parameter PP[m:1] may be latched to provide latched performance parameters PPL[5:1].

At this time, latched performance parameters PPL[m:1] may have a value (shown as PPL-W33) for operating within temperature range W33.

Figure 26:
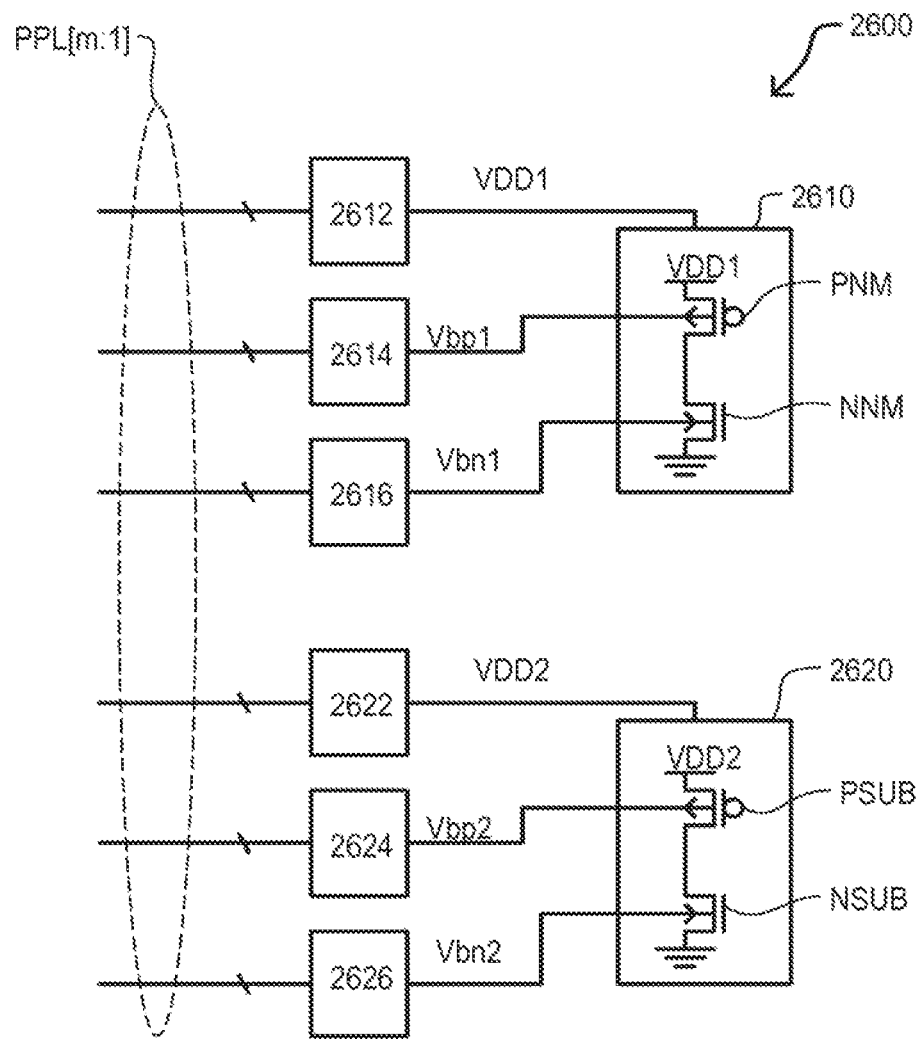
FIG. 26 is a circuit schematic diagram of performance parameter adjusted circuits according to an embodiment.

Referring now to FIG. 26, a circuit schematic diagram of performance parameter adjusted circuits according to an embodiment is set forth and given the general reference character 2600.

Performance parameter adjusted circuits 2600 may be used in a semiconductor device (such as semiconductor devices 100 and 2300) that have sub-threshold voltage operating circuits and above sub-threshold voltage operating circuits. A sub-threshold voltage operating circuit is a circuit that operates at a power supply potential level below the threshold voltages of the included transistors (i.e. IGFETs). An above sub-threshold voltage operating circuit is a circuit that operates at a power supply potential level above the threshold voltages of the included transistors (i.e. IGFETs).

Performance parameter adjusted circuits 2600 can include above sub-threshold voltage operating circuits 2610, sub-threshold voltage operating circuits 2620, power supply generating circuits (2612 and 2622), and back bias voltage generating circuits (2614, 2616, 2624, and 2626).

Above sub-threshold voltage operating circuits 2610 can include circuits that are configured of p-channel IGFETs PNM and n-channel IGFETs NNM. P-channel IGFETs PNM may receive a back body bias Vbp1 and n-channel IGFETs NNM may receive a back body bias Vbn1. The circuits in above sub-threshold voltage operating circuits 2610 may receive a power supply VDD1.

Sub-threshold voltage operating circuits 2620 can include circuits that are configured of p-channel IGFETs PSUB and n-channel IGFETs NSUB. P-channel IGFETs PSUB may receive a back body bias Vbp2 and n-channel IGFETs NSUB may receive a back body bias Vbn2. The circuits in above sub-threshold voltage operating circuits 2620 may receive a power supply VDD2.

Each of power supply generating circuits (2612 and 2622), and back bias voltage generating circuits (2614, 2616, 2624, and 2626) may receive a unique plurality (subset) of latched performance parameters (PPL[m:1]) as inputs and may adjust the potentials of their outputs in response thereto.

Power supply generating circuit 2612 may receive a plurality of latch performance parameters (PPL[m:1]) as inputs and may provide a power supply VDD1 as an output. Power supply VDD1 may be used as a power supply for above sub-threshold voltage operating circuits 2610. In this way, the potential of power supply VDD1 may vary in response to a temperature range in which the semiconductor device is operating.

Back bias voltage generating circuit 2614 may receive a plurality of latch performance parameters (PPL[m:1]) as inputs and may provide a back body bias Vbp1 as an output. Back body bias Vbp1 may be used as back body bias for p-channel IGFETs PNM in above sub-threshold voltage operating circuits 2610. In this way, the potential of back body bias Vbp1 may vary in response to a temperature range in which the semiconductor device is operating.

Back bias voltage generating circuit 2616 may receive a plurality of latch performance parameters (PPL[m:1]) as inputs and may provide a back body bias Vbn1 as an output. Back body bias Vbn1 may be used as back body bias for n-channel IGFETs NNM in above sub-threshold voltage operating circuits 2610. In this way, the potential of back body bias Vbn1 may vary in response to a temperature range in which the semiconductor device is operating.

Power supply generating circuit 2622 may receive a plurality of latch performance parameters (PPL[m:1]) as inputs and may provide a power supply VDD2 as an output. Power supply VDD2 may be used as a power supply for sub-threshold voltage operating circuits 2620. In this way, the potential of power supply VDD2 may vary in response to a temperature range in which the semiconductor device is operating.

Back bias voltage generating circuit 2624 may receive a plurality of latch performance parameters (PPL[m:1]) as inputs and may provide a back body bias Vbp2 as an output. Back body bias Vbp2 may be used as back body bias for p-channel IGFETs PSUB in sub-threshold voltage operating circuits 2620. In this way, the potential of back body bias Vbp2 may vary in response to a temperature range in which the semiconductor device is operating.

Back bias voltage generating circuit 2626 may receive a plurality of latch performance parameters (PPL[m:1]) as inputs and may provide a back body bias Vbn2 as an output. Back body bias Vbn2 may be used as back body bias for n-channel IGFETs NSUB in sub-threshold voltage operating circuits 2620. In this way, the potential of back body bias Vbn2 may vary in response to a temperature range in which the semiconductor device is operating.

As described above, performance parameter adjusted circuits 2600 in a semiconductor device (100 and 2300) may have tight control over back body biases (Vbp1, Vbn1, Vbp2, and Vbn2) and power supply voltages (VDD1 and VDD2) to control threshold voltages and power supply voltages of operational circuits for both above sub-threshold voltage operating circuits 2610 and sub-threshold operating circuits 2620 in a plurality of temperature ranges (such as temperature ranges W1 to W2" shown in FIG. 16) so that speed and power consumption may be improved without designing for margins at extreme corners.

A temperature circuit may include, for example, temperature sensor circuits (120 and 140) and/or temperature sensor circuit 2310.

A temperature circuit can provide a plurality of temperature ranges, each temperature range having a temperature range upper limit value and a temperature range lower limit value, with adjacent ones of the plurality of temperature ranges overlap. The temperature ranges may be utilized to provide performance parameters to performance parameter adjustable circuits to provide improved operating performance of the device over a wide range of temperatures.

Semiconductor device (100 and 2300) can be a dynamic random access memory (DRAM), static random access memory (SRAM), non-volatile memory (such as a FLASH memory device using floating gate memory cells or phase change RAM using programmable resistive devices), processor, or general semiconductor device, as just a few examples.

Other electrical apparatus other than semiconductor devices may benefit from the invention.

While various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A method of operating a semiconductor device, comprising:
   in response to a power supply voltage transitioning to at least a first potential, setting a temperature range of a temperature window to a first range by operation of a temperature circuit formed on the semiconductor device; and
   in response to a temperature of the semiconductor device being determined to be outside of the first temperature range, changing the temperature range of the temperature window until the temperature of the semiconductor device is determined to be within the temperature window.

2. The method of claim 1, further including:
   changing the temperature range of the temperature window includes incrementing a count value by operation of a counter circuit.

3. The method of claim 1, wherein:
   after the temperature of the semiconductor device is within the temperature window, outputting performance parameter values from a performance parameter table to operational circuits based on the temperature range of the temperature window; wherein
   the operation of the operational circuits is modified by the performance parameter values.

4. The method of claim 1, wherein:
   the semiconductor device comprises a dynamic random access memory device.

5. The method of claim 4, wherein:
   the temperature window is stored on the semiconductor device as a multi-bit value having at least 4 binary bits.

6. The method of claim 5, wherein:
   the multi-bit value has at least 5 binary bits.

7. The method of claim 1, wherein:
   the semiconductor device is configured to set the temperature window to any of a plurality of temperature ranges in which the semiconductor device can operate.

8. The method of claim 7, wherein:
   the first range is about midway between the highest and lowest of the plurality of temperature ranges.

9. The method of claim 7, wherein:
   at least one of the temperature ranges overlaps a portion of another of the temperature ranges.

10. The method of claim 9, wherein:
    the temperature ranges include a highest temperature range, a lowest temperature range, and a plurality of intermediate temperature ranges, each intermediate temperature range overlapping a portion of an adjacent temperature range.

11. A method of operating a semiconductor device, comprising:
    in response to at least one predetermined condition of the semiconductor device, establishing a first temperature window for the semiconductor device by operation of a temperature circuit formed on the semiconductor device; and
    in response to a temperature of the semiconductor device being determined to be outside of the first temperature window, by operation of the temperature circuit, establishing a second temperature window that is determined to include the temperature of the semiconductor device; wherein the first temperature window corresponds to a first temperature range, the second temperature window corresponds to a second temperature range, the first and second temperature ranges being separated by a plurality of temperature ranges.

12. The method of claim 11, wherein:
the at least one predetermined condition includes a power supply voltage of the semiconductor device transitioning from at least a first potential to a second potential.

13. The method of claim 11, wherein:
the semiconductor device is configured to operate in any one of a plurality of temperature windows, including a highest temperature window and a lowest temperature window; and
the first temperature window is between the highest and lowest temperature windows.

14. The method of claim 11, wherein:
the semiconductor device is configured to operate in any one of a plurality of temperature windows and includes a table storing performance values for at least some of the temperature windows; and
in response to establishing the second temperature window, outputting performance parameters from the table corresponding to the second temperature window to operational circuits; wherein
the operation of the operational circuits is modified by the performance parameter values.

15. The method of claim 11, wherein:
the semiconductor device is a semiconductor memory device.

16. The method of claim 11, wherein:
the semiconductor device is a processor.

17. The method of claim 11, wherein:
the semiconductor device is a dynamic random access memory device; and
establishing the first temperature window includes setting a multi-bit window value of at least 4 binary bits to an initial value.

18. The method of claim 17, wherein:
the multi-bit window value includes at least 5 binary bits.

19. The method of claim 17, wherein:
establishing the second temperature window by changing the multi-bit window value in response to a detected temperature of the semiconductor device.

20. The method of claim 19, wherein:
changing the multi-bit window value includes incrementing or decrementing the multi-bit window value.

* * * * *